United States Patent [19]

Kawatani et al.

[11] Patent Number: 5,540,247
[45] Date of Patent: Jul. 30, 1996

[54] IMMERSION-TYPE APPARATUS FOR PROCESSING SUBSTRATES

[75] Inventors: Masafumi Kawatani, Shiga-ken; Kouzou Terashima, Kyoto; Hazime Shirakawa, Shiga-ken, all of Japan

[73] Assignee: Dainippon Screen Mfg. Co., Ltd., Japan

[21] Appl. No.: 349,446

[22] Filed: Dec. 5, 1994

[30] Foreign Application Priority Data

Dec. 8, 1993 [JP] Japan ................... 5-340707

[51] Int. Cl.⁶ .................... B08B 3/04
[52] U.S. Cl. ............... 134/182; 134/902
[58] Field of Search .............. 134/902, 154, 134/182, 183, 199; 68/181 R; 366/173.1, 173.2, 174.1, 175.2

[56] References Cited

U.S. PATENT DOCUMENTS 1,436,700  11/1922  Eliel ................... 366/173.2 X
2,603,460  7/1952  Kalinske ............. 366/174.1 X
3,648,985  3/1972  Matweecha ......... 366/173.1 X
4,092,176  5/1978  Kozai et al. ............ 134/199 X
5,186,192  2/1993  Netsu et al. ............ 134/902 X

FOREIGN PATENT DOCUMENTS 83036   5/1982  Japan ................... 134/902
521444  3/1993  Japan .

*Primary Examiner*—Philip R. Coe
*Attorney, Agent, or Firm*—Ostrolenk, Faber, Gerb & Soffen, LLP

[57] ABSTRACT

A holding rod is disposed in a processing bath close to the bottom of the processing bath. The holding rod is located in a bottom center portion of the processing bath between two processing fluid supply pipes. Since the holding rod serves as diaphragm means, a processing fluid from outlet holes rushing toward the bottom center portion of the processing bath along the bottom of the processing bath hits the holding rod, changes its direction upward and starts uniformly circulating in the processing bath.

12 Claims, 22 Drawing Sheets

F I G .1
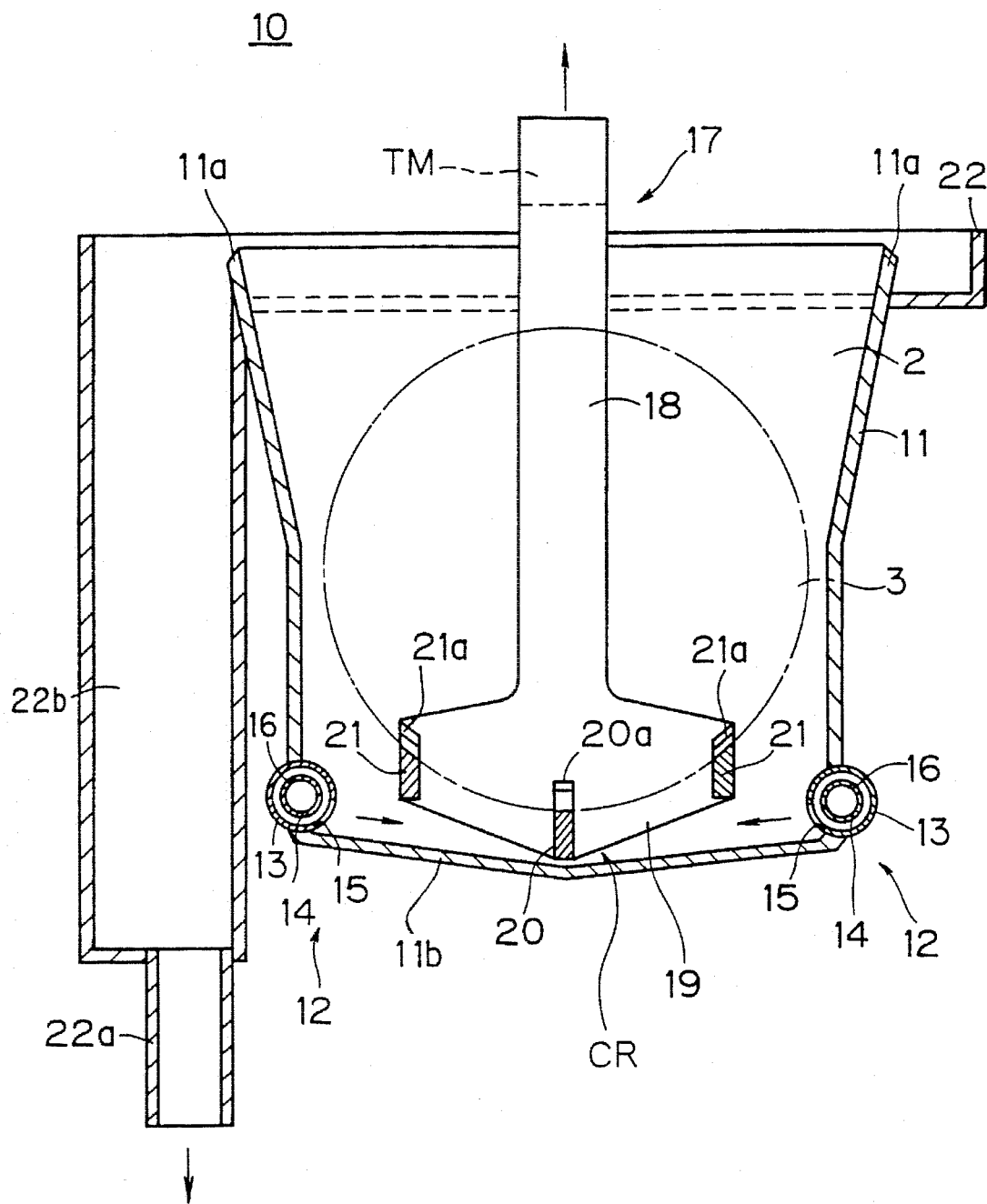

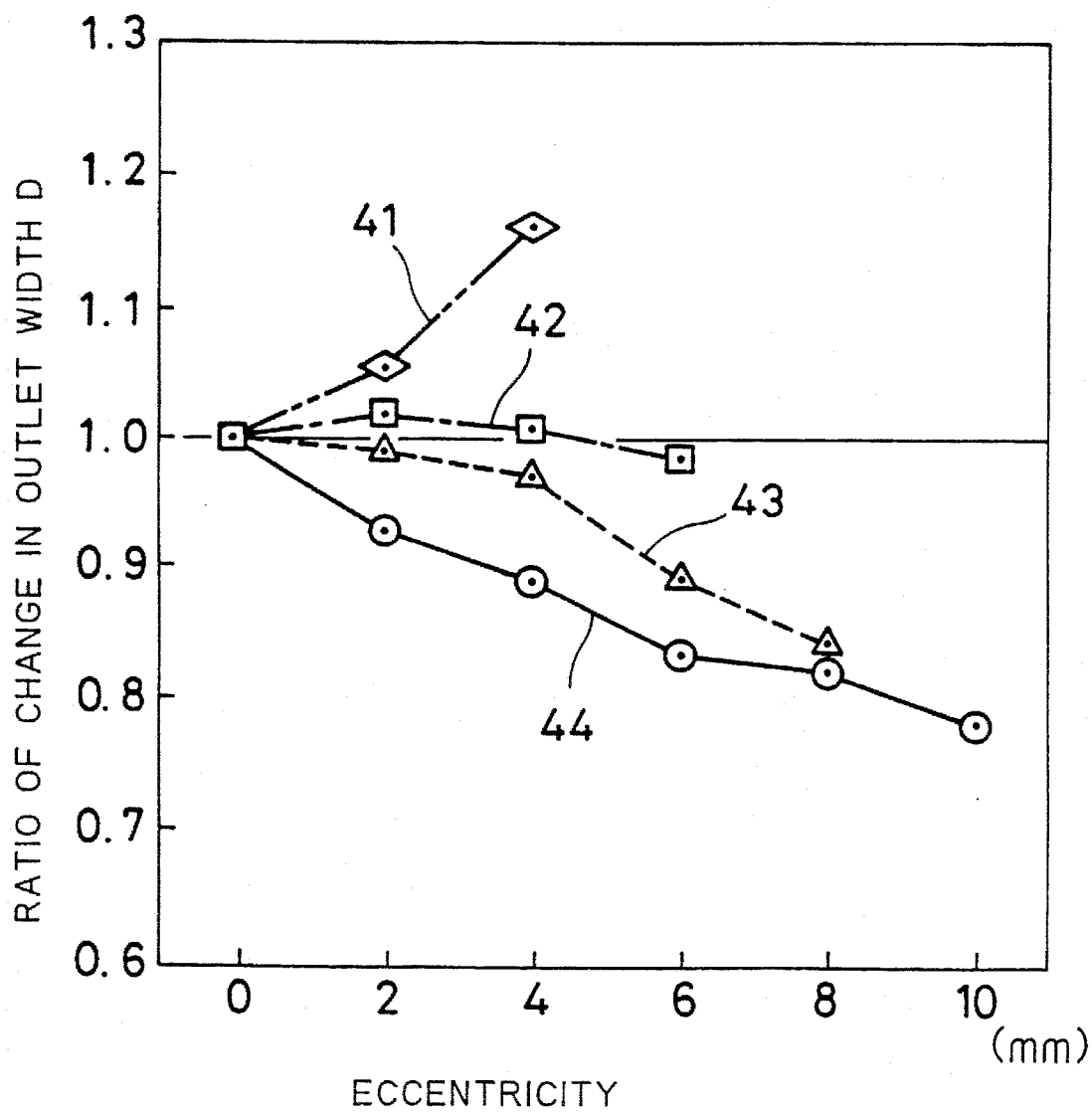

5,540,247

IMMERSION-TYPE APPARATUS FOR PROCESSING SUBSTRATES

BACKGROUND OF THE INVENTION

1. Field of the Invention

The present invention relates to an immersion-type substrate processing apparatus for processing a thin plate substrate such as a semiconductor substrate and a glass substrate for a photomask (hereinafter simply "substrate"). The present invention also relates to a method of controlling flows of a processing fluid in a processing bath wherein a substrate is immersed.

2. Description of the Background Art

FIG. 23 is a vertical cross sectional view showing major portions of a conventional immersion-type substrate processing apparatus.

A processing bath 1 is filled with a processing fluid 2 such as a cleaning fluid and a chemical fluid (hereinafter simply "processing fluid"). Lower rims of substrates 3 are inserted into guide grooves 7a of three substrate holding poles 7 which extend in a direction perpendicular to the plane of FIG. 23, resulting in that the substrates 3 are held upright by the substrate holding poles 7. Held by the substrate holding poles 7, the substrates 3 are immersed into the processing fluid 2, whereby predetermined treatments for surfaces of the substrates 3 are performed.

Processing fluid supply pipes 4 are disposed below the substrates 3 in the processing bath 1. The processing fluid supply pipes 4 penetrate the processing bath 1 outside at side walls of the processing bath 1 in a direction perpendicular to the plane of FIG. 23, and are fixed liquid-tight at through holes of the processing bath 1.

The processing fluid supply pipes 4 are single-layer pipes. On a side surface of each processing fluid supply pipe 4, a plurality of fluid outlet holes 5 are formed in a line at predetermined intervals in a direction perpendicular to the plane of FIG. 23 toward approximate centers of the substrates 3. A predetermined processing fluid 2 is supplied to the fluid supply pipes 4 from a processing fluid supply apparatus (not shown) which is disposed external to the processing bath 1. The processing fluid 2 is gushed out from the outlet holes 5 toward the substrates 3.

Jet flows of the processing fluid 2 sweep upward over the surfaces of the substrates 3 and the processing fluid 2 flows over a brim 1a of the processing bath 1 to be collected by an external bath 6 which is externally attached to the periphery of the processing bath 1. The processing fluid 2 thus collected is then drained through a drain pipe 6a.

In this manner, the surfaces of the substrates 3 are processed in the processing bath 1 with the processing fluid 2 which rushes from below toward upward and flows over the brim of the processing bath (Overflow method). Since there is always a fresh supply of the processing fluid 2, the processing time is short.

Nevertheless, the overflow method as above has a limited success in supplying a processing fluid to an immersion-type substrate processing apparatus. That is, some of the processing fluid 2 which is supplied through the processing fluid supply pipes 4 into the processing bath 1 stagnates in some particular area. Inconveniently enough, there is no new supply of the processing fluid 2 to this particular area (The a particular area where the processing fluid 2 stagnates will be hereinafter referred to as the "stagnant zone.").

FIG. 24 is a diagram showing flows of the processing fluid 2 across a central cross section of the processing bath 1.

Jet flows of the processing fluid 2 from the outlet holes 5 of the right side and the left side processing fluid supply pipes 4 collide each other in the vicinity of the center of the substrate 3 and deviate from each other toward the right and the left sides. Some jet flows flow outside over the brim 1a and other jet flows turn downward along the inner side walls of the processing bath 1. The latter jet flows of the processing fluid 2 then start circulating in the bath and eventually flow outside over the brim 1a.

Some of the flows of the processing fluid 2 returning to the bottom of the processing bath 1 remain circulating slowly halfway between the right side and the left side processing fluid supply pipes 4 as stagnant eddies 2a and 2b. Since there is not much supply of the processing fluid 2 directly to these areas, the stagnant eddies 2a and 2b become a stagnant zone A.

No matter how much processing fluid 2 is supplied from the processing fluid supply pipes 4, there will be almost no new supply of the processing fluid 2 to the stagnant zone A. This causes the processing fluid 2 to remain circulating the same area. Therefore, if particles or extraneous materials such as heavy metal created during surface processing of the substrates 3 (hereinafter simply "extraneous materials") are caught in the stagnant zone A, the extraneous materials will not be carried by jet flows outside the processing bath 1 over the brim 1a. Instead, the extraneous materials will stay in the stagnant zone A forever.

The extraneous materials trapped in the stagnant zone A tend to adhere to the surface of the substrate 3, thereby deteriorating the processing of the substrate.

There is another problem with this conventional method. The amount of the processing fluid 2 ejected from the outlet holes 5 is sometimes different between the right side and the left side processing fluid supply pipes 4. If this difference becomes large, other stagnant zone will be created in other region, again causing the problem as above.

SUMMARY OF THE INVENTION

In a first aspect of the present invention, an immersion-type substrate processing apparatus for immersing a substrate into a processing fluid and processing surfaces of the substrate, comprises: a processing bath for containing the processing fluid, the processing bath having a bottom surface; two processing processing fluid supply pipes provided in the vicinity of the bottom surface of the processing bath parallel to each other but spaced away from each other by a predetermined distance, the processing fluid supply pipes each including an outlet hole through which the processing fluid is gushed out approximately parallel to or toward the bottom surface of the processing bath; processing fluid supply means disposed external to the processing bath so as to supply the processing fluid to the processing fluid supply pipes; and diaphragm means disposed close to the bottom surface of the processing bath in a bottom center portion of the processing bath between the processing fluid supply pipes so as to change the direction of the processing fluid ejected out from the outlet holes so that the processing fluid flows toward an upward direction.

Thus, in the first aspect of the present invention, the processing fluid ejected from outlet holes flows along the bottom surface of the processing bath toward the bottom center portion which is close to the bottom surface of the processing bath and which is between the processing fluid supply pipes. The processing fluid hits the diaphragm means, turns upward at the diaphragm means, and starts uniformly circulating in the processing bath.

In the second aspect of the present invention, the processing fluid supply pipes each includes an external pipe and at least one internal pipe which is inserted in the external pipe to have a multi-layer pipe structure, the outlet hole is formed in the external pipe as a main outlet hole, and the at least one internal pipe includes a sub outlet hole on a side surface thereof, an opening phase of the sub outlet hole formed in the at least one internal pipe is deviated from an opening phase of the main outlet hole formed in the external pipe so that openings of the main and sub outlet holes are not aligned with each other, and wherein the processing fluid supply means is connected to the inner most internal pipes of the processing fluid supply pipes to supply the processing fluid into the processing bath.

The present invention is also directed to a method of controlling flows of a processing fluid in a processing bath which has a bottom surface, comprising the following steps of: providing, in the processing bath, two processing fluid supply pipes in the vicinity of the bottom surface to be parallel to each other but spaced away from each other by a predetermined distance, each processing fluid supply pipes having an outlet hole for gushing out the processing fluid; supplying the fluid to the processing processing fluid supply pipes to gush out the processing fluid approximately parallel to or toward the bottom surface of the processing bath; providing, in the processing bath, diaphragm means close to the bottom surface; and changing the direction of the processing fluid gushed out from the outlet holes by the diaphragm means so that the processing fluid flows toward an upward direction.

Accordingly, it is an object of the present invention to offer an immersion-type substrate processing apparatus which creates as few stagnant zones as possible in a processing bath.

It is another object of the present invention to offer an immersion-type substrate processing apparatus in which flow speeds of a processing fluid are equalized.

It is further another object of the present invention to offer a method of controlling flows of a processing fluid in an immersion-type substrate processing apparatus so that the processing fluid evenly circulates within the processing bath, whereby no stagnant zone is created.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view showing major pails of an immersion-type substrate processing apparatus according to a first preferred embodiment of the present invention;

FIG. 15 is a graph plotting an outlet width against an eccentricity of an internal pipe;

DESCRIPTION OF THE PREFERRED EMBODIMENTS

Immersion-type apparatuses for processing substrates according to preferred embodiments of the present invention will be described in the following with reference to corresponding drawings. It is to be noted that the scope of the invention is not limited by the description below.

Figure 17C:
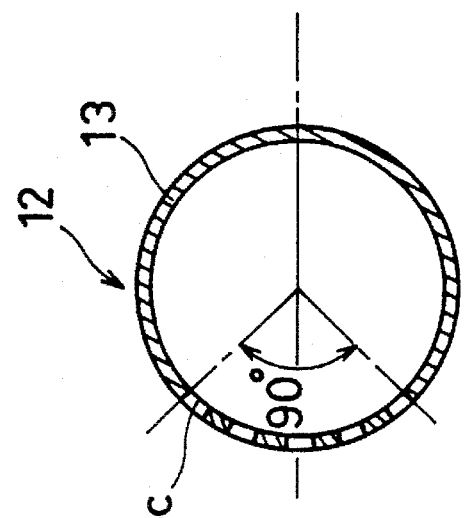
FIGS. 17A, 17B and 17C are views showing modifications of main outlet holes.
Figure 17B:
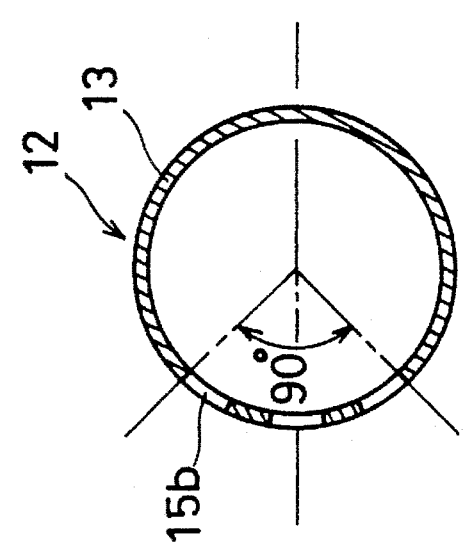
Figure 17A:
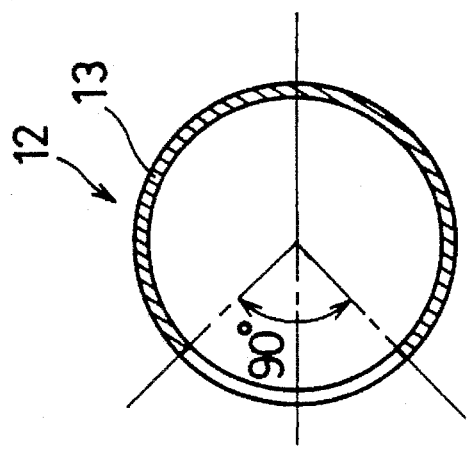

As herein termed, "opening angle" of a jet outlet refers to a central angle of the opening of the jet outlet with respect to the center of a processing fluid supply pipe. In other words, this is an angle bounded by two dash-dotted lines which connect between the ends of the opening and the center point of the pipe as shown in FIGS. 17A to 17C. On the other hand, "opening phase" refers to a relative position of the opening angle around the center of the processing fluid supply pipe.

<First Preferred Embodiment>

FIG. 1 is a view showing major parts of an immersion-type substrate processing apparatus according to a first preferred embodiment of the present invention.

A processing bath 11 made of quartz is a little wider than the diameter of a substrate 3. The processing bath 11 tapers downward toward a bottom surface 11b there of. The bottom surface 11b is a little deeper at the center to have a valley-like cross section. With respect to the configuration of the processing bath 11, the processing bath 11 may not taper downward toward the bottom, but rather may have upright side walls.

An external bath 22 made of quartz is attached to external peripheral walls of the processing bath 11. The processing fluid 2 flowing outside the processing bath 11 over the brim 11a is collected by the external bath 22 and supplied to a drain tank 38 (See FIG. 5) through a drain pipe 22a.

Since the external bath 22 includes a deeper bath 22b, even if the amount of the processing fluid 2 flowing outside the processing bath 11 temporarily exceeds the amount of the processing fluid 2 drained through the drain pipe 22a, there will be no overflow of the processing fluid 2 from the external bath 22.

Two processing fluid supply pipes 12 made of quartz are welded liquid-tight to the opposite corners of the bottom surface 11b of the processing bath 11 to extend in a direction which is perpendicular to the plane of FIG. 1. The processing processing fluid supply pipes 12 are approximately parallel to each other with a predetermined distance away from each other. In the description below, an area CR near the bottom surface 11b of the processing bath 11 between the two processing fluid supply pipes 12 will be referred to as the "bottom center portion" for the convenience of description.

Figure 2:
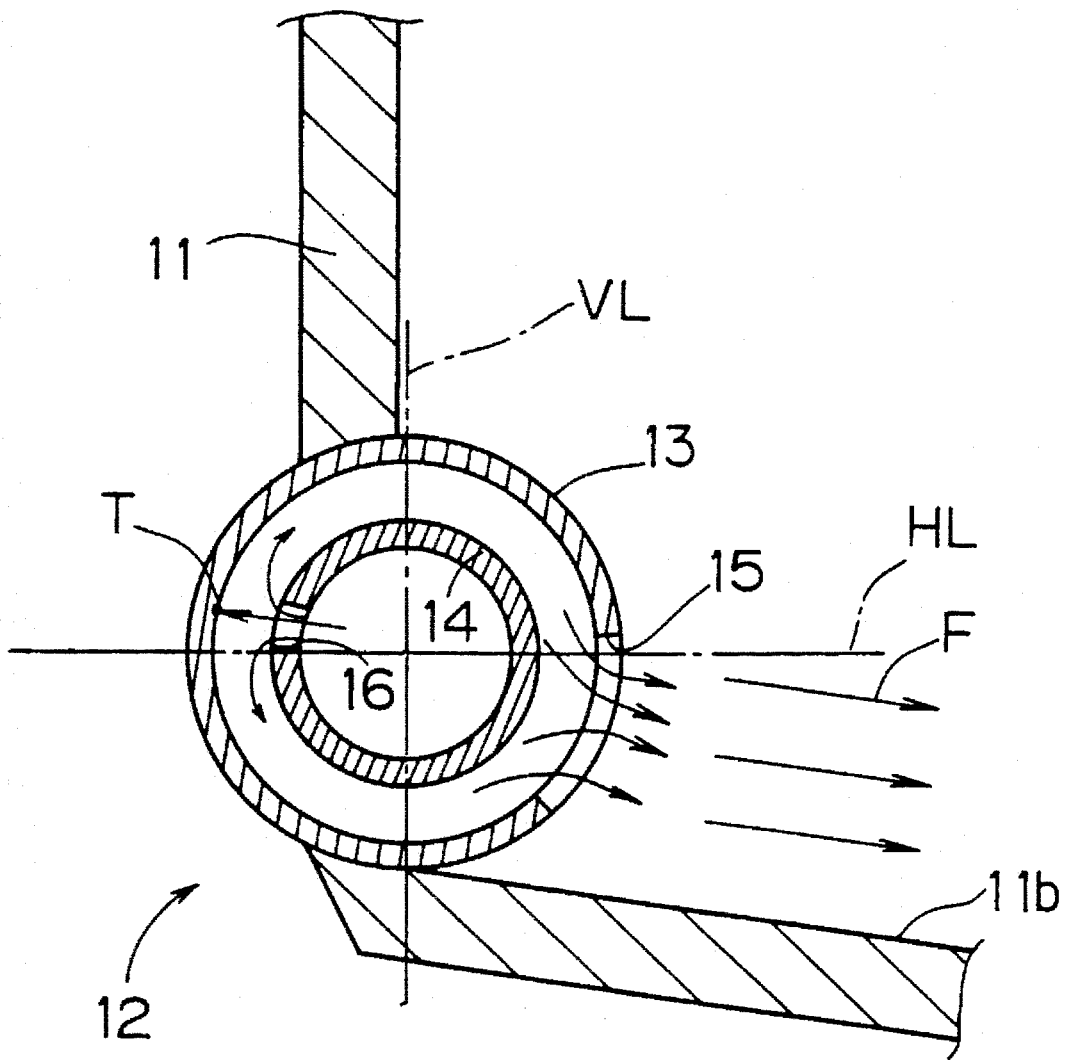
FIG. 2 is an enlarged vertical cross sectional view of a processing fluid supply pipe and a portion around the same in the first preferred embodiment of the present invention.

As can be seen in the enlarged cross sectional view of FIG. 2, the processing fluid supply pipes 12 each have a dual-layer pipe structure in which an internal pipe 14 is coaxially inserted in an external pipe 13. At an angle downward from a horizontal line HL of the external pipe 13, a plurality of main outlet holes 15 each bored in the form of a slit are formed in the external pipe 13 perpendicular to the longitudinal direction of the external pipe 13 (i.e., in a direction perpendicular to the plane of FIG. 2) to be parallel to each other. The internal pipe 14 has a plurality of sub outlet holes 16 which are formed in a line at predetermined intervals along the length of the internal pipe 14 (described in detail later). The sub outlet holes 16 are located to have their centers of the openings exactly 180 degrees shifted away from the centers of the openings of the main outlet holes 15. In FIG. 2, VL is a vertical line of the external pipe 13.

As shown in FIG. 2, in each processing fluid supply pipe 12 having such a structure as above, the processing fluid 2 ejected from the sub outlet holes 16 of the internal pipe 14 hits the interior wall of the external pipe 13 at points T. At these collision points T, the speed of the processing fluid 2 is killed to zero. From the collision points T each serving as a new turning point toward the main outlet holes 15, the jet flows of the processing fluid 2 rush through between the external pipe 13 and the internal pipe 14 and squirt from the main outlet holes 15. The processing fluid 2 from the main outlet holes 15 then rushes toward the bottom center portion CR which is located between the processing fluid supply pipes 12 approximately parallel to the bottom surface 11b of the processing bath 11 as indicated by the arrows F.

Although the first preferred embodiment requires to arrange the plurality of sub outlet holes 16 in a line along the length of the internal pipe 14, the internal pipe 14 may have one longitudinally extending slit hole which functions as the sub outlet holes 16. In addition, the processing fluid supply pipes 12 are not limited to dual-layer structure pipes as in the first preferred embodiment. Rather, the processing fluid supply pipes 12 each may be a single-layer pipe which does not include the internal pipes 14. It is to be noted however that use of the dual-layer structure pipes 12 is more advantageous. This will be described in detail later after describing the first to the third preferred embodiments.

Further, although the first preferred embodiment causes the processing fluid 2 from the main outlet holes 15 to rush approximately parallel to the bottom surface 11b of the processing bath 11 toward the bottom center portion CR, the main outlet holes 15 may open at a wider opening angle so that the processing fluid 2 is gushed out from the processing fluid supply pipes 12 at a wider ejection angle. In such a case, the main outlet holes 15 may be directed to the horizontal line HL or upward. Alternatively, the processing fluid 2 may be gushed out toward the bottom surface 11b. In either case, the processing fluid 2 flows along the bottom surface 11b toward the bottom center portion CR.

Referring again to FIG. 1, indicated at 17 is a substrate holder for holding a plurality of substrates 3 at predetermined intervals in an upright direction. The substrate holder 17 is comprised of a suspending member 18 and a base holding frame 19 suspended from a lower portion of the suspending member 18. Three holding rods 20, 21 and 21 are attached to the base holding frame 19 to extend in a direction perpendicular to the plane of FIG. 1. Guide grooves 20a, 21a and 21a of equal pitches p are notched in top surfaces of the holding rods 20, 21 and 21, respectively. With lower rims inserted in the guide grooves 20a, 21a and 21a, the substrates 3 are held on end within the processing bath 11.

Figure 3:
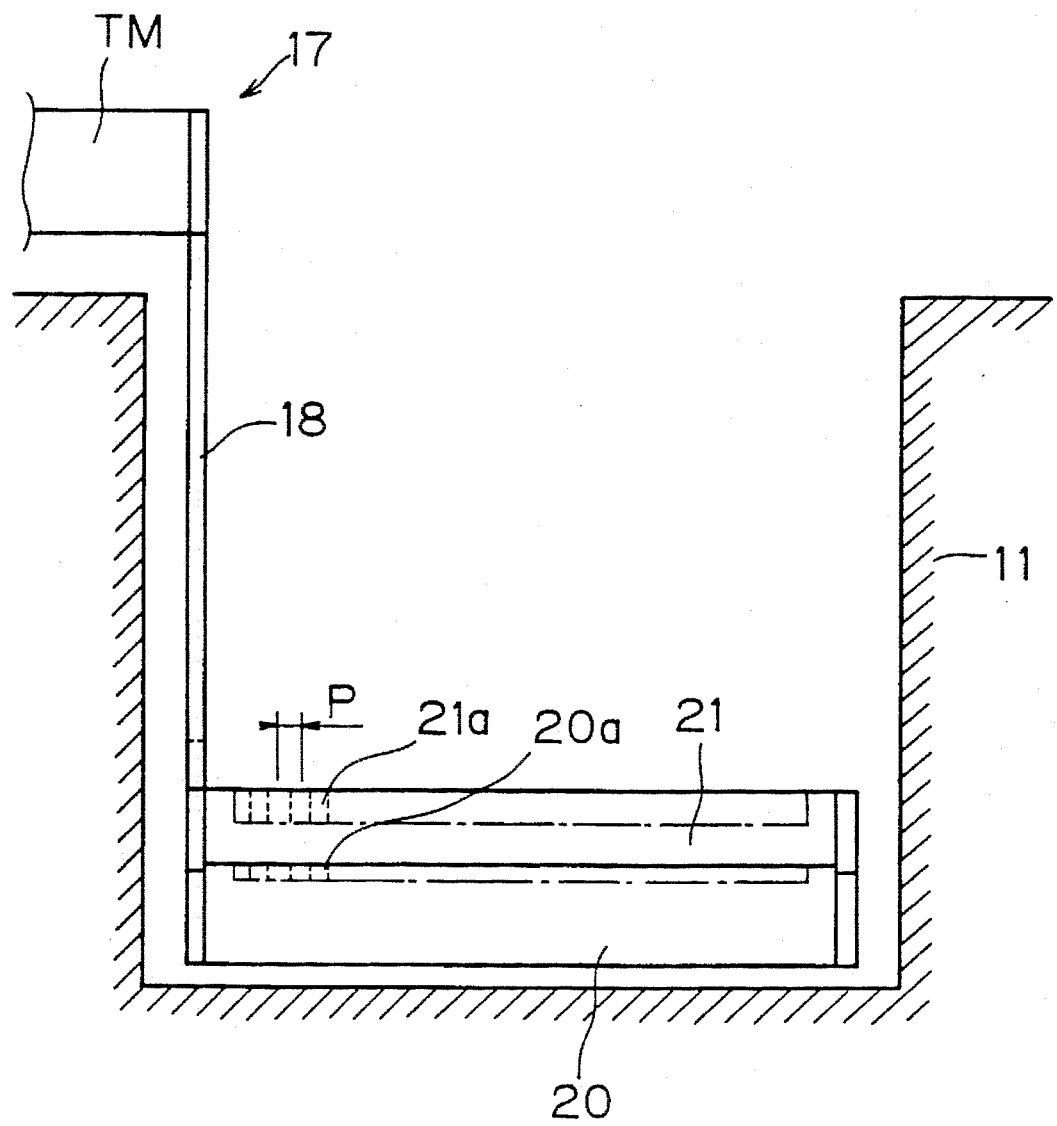
FIG. 3 is a side view of a substrate holder of the first preferred embodiment of the present invention.
Figure 4:
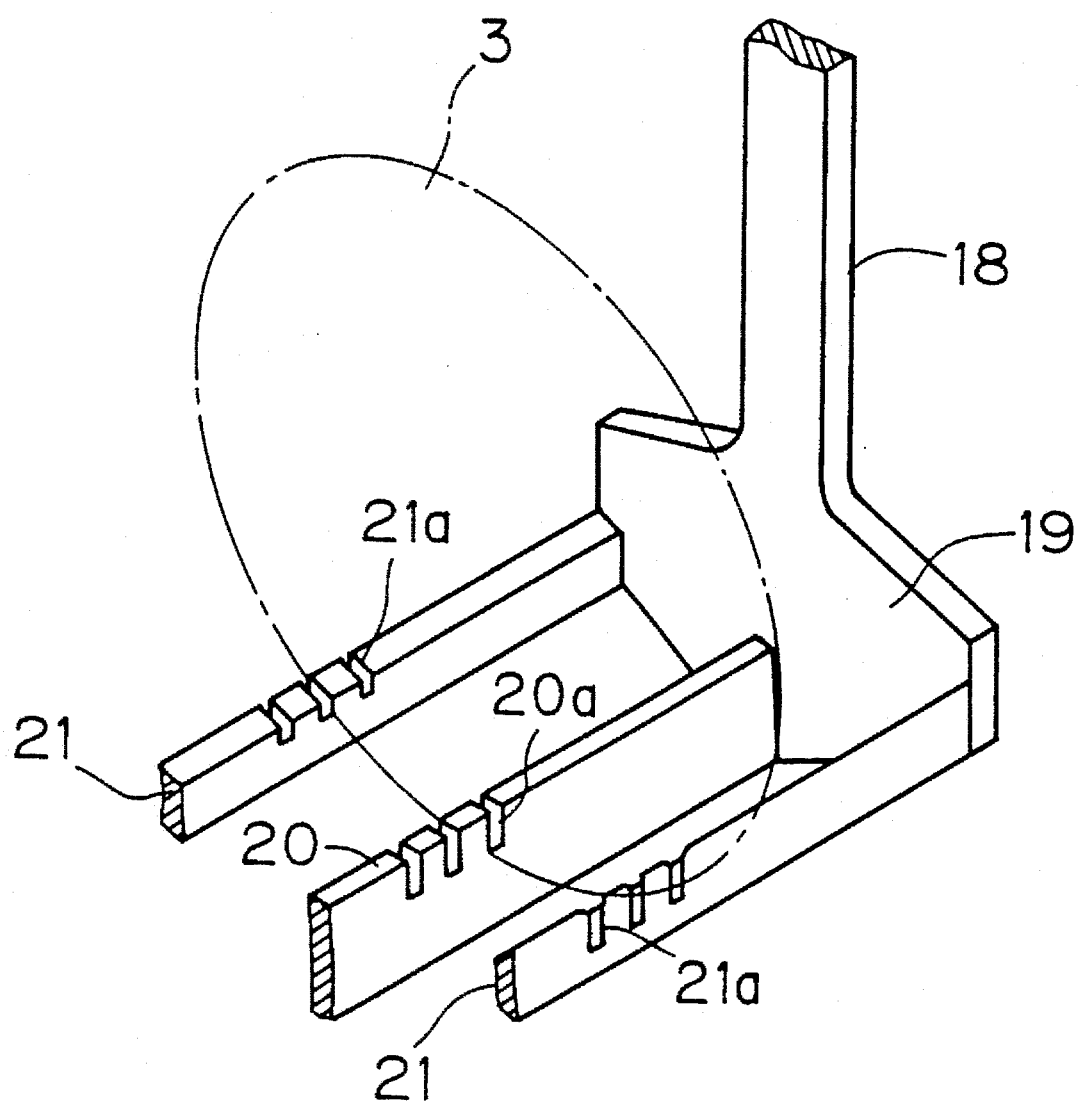
FIG. 4 is a perspective view of the substrate holder of the first preferred embodiment of the present invention.

FIG. 3 shows the substrate holder 17 as viewed from side, and FIG. 4 is a partial perspective view of the substrate holder 17. In FIG. 3, the holding rods 20, 21 and 21 extend horizontally from the base holding frame 19. The suspending member 18 is supported at an upper portion by a transfer mechanism TM which transfers the substrate holder 17 between a plurality of processing stations. Hence, with the transfer mechanism TM, it is possible to remove the substrates 3 as they are held by the substrate holder 17 from the processing bath 11 and to transfer the substrates 3 to other places. As compared with where a chuck is inserted into the processing bath 11 to hold and transfer the substrates 3, this transportation method is more advantageous in that the processing bath 11 needs not be so wide to receive a chuck and accordingly a smaller amount of the processing fluid 2 necessary.

As measured in the vertical direction, the holding rod 20 located between the holding rods 21 and 21 is longer than the holding rods 21 and 21 in the first preferred embodiment. As shown in FIG. 1, in processing the substrates 3 by immersing the substrate holder 17 into the processing bath 11, the holding rod 20 serves as diaphragm means at the bottom center portion CR. That is, supplied from the processing processing fluid supply pipes 12 toward the bottom center portion CR, jets of the processing fluid 2 flow along the bottom surface 11b and hit a lower portion of the holding rod 20. As a result, the jets of the processing fluid 2 turns upward. The upward flows of the processing fluid 2 then sweep over the surfaces of the substrates 3. Some of the upward jets flow outside the processing bath 11 over the brim 11a, while the other upward jets turn downward along the side walls of the processing bath 11 and join new flows of the processing fluid 2 ejected from the main outlet holes 15. Thus, the processing fluid 2 evenly circulates within the processing bath 11, whereby no stagnant zone is created.

Even if more fluid is supplied from one of the processing processing fluid supply pipes 12 than from the other, since the processing fluid 2 rushing along the bottom surface 11b always hits the holding rod 20 and turns upward without any exception, jet flows from the two processing fluid supply pipes 12 never interfere with each other in the bottom center portion CR. Hence, a difference in the amount of supply between the two processing fluid supply pipes 12 does not create a stagnant zone. Nevertheless, it is of course desirable to accurately control the amount of supply from the right side and the left side processing processing fluid supply pipes 12 so that there will be no imbalance between jet flows in a right side area and a left side area of the processing bath 11.

Figure 5:
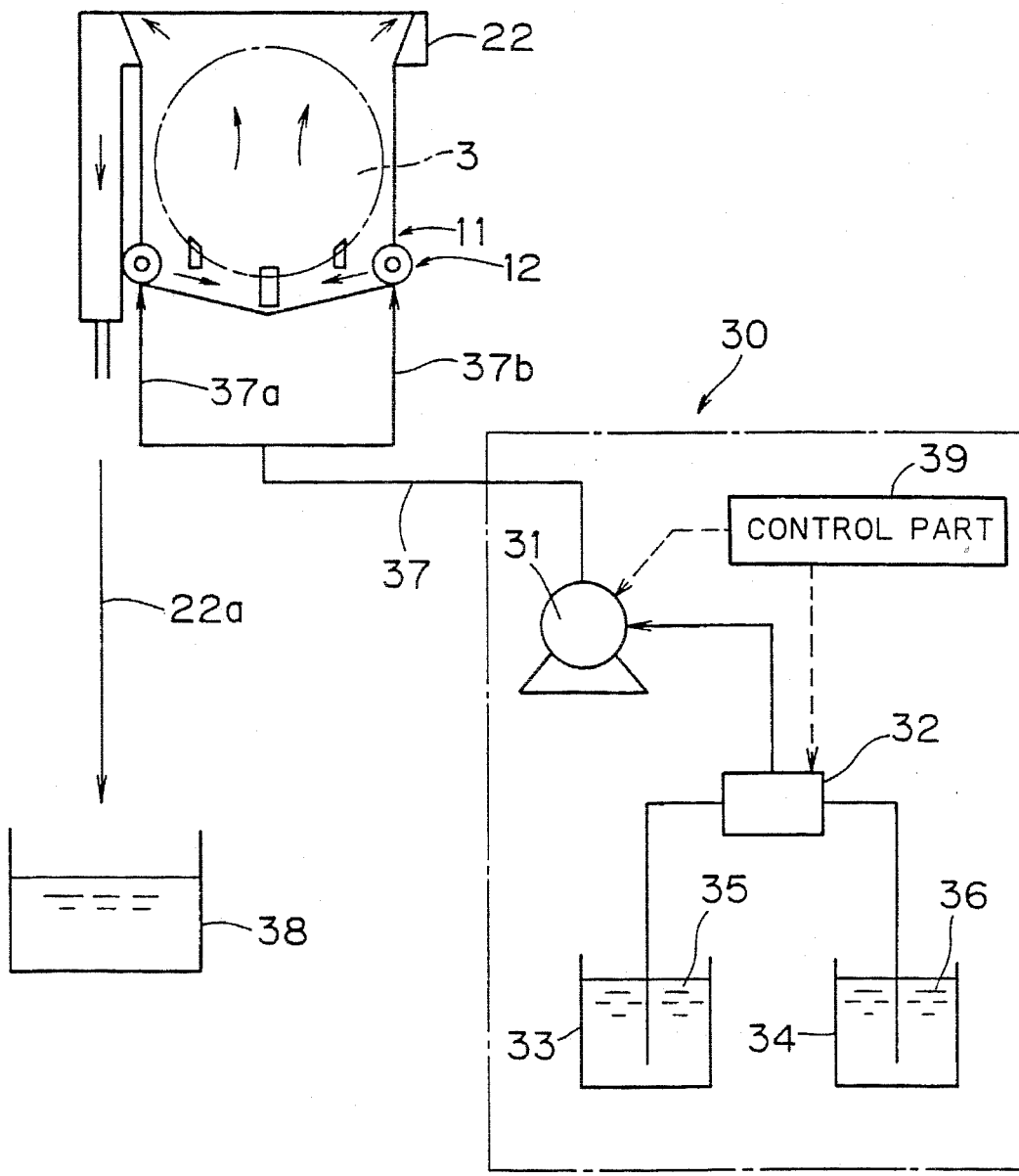
FIG. 5 is a view showing a structure of a processing fluid supply apparatus of the immersion-type substrate processing apparatus of the present invention.

FIG. 5 is a view showing a structure of a processing fluid supply apparatus 30.

An electric pump 31 selectively pumps up a chemical fluid 35 or pure water 36 respectively from a chemical fluid tank 33 or a pure water tank 34 by means of a switching operation of an electro-magnetic valve 32, and supplies the selected fluid to the internal pipe 14 of each processing fluid supply pipe 12 through a supply tube 37.

The chemical fluid 35 or the pure water 36 flowing outside the processing bath 11 is collected by the external bath 22 and introduced into the drain tank 38 through the drain pipe 22a.

A control part 39 controls operations of the electric pump 31 and the electro-magnetic valve 32 which selects which type of the processing fluid 2 is to be supplied.

A flow sensor may be disposed in the supply tube 37. In this case, the control part 39 controls operations of the electric pump 31 based on a feedback supplied from the flow sensor so that a supply of the processing fluid 2 is more accurately controlled. In addition, although the two processing fluid supply pipes 12 having the identical structure should be able to supply exactly the same amount of the processing fluid 2, since the two supply pipes 12 could be manufactured slightly different from each other, a flow control valve may be attached to either one or the both of flow paths 37a and 37b to finely control a supply of the processing fluid 2.

Further, a reduction in the running cost is possible if the processing fluid 2 collected by the drain tank 38 is purified through a filter or other suitable means and used again.

Figure 6:
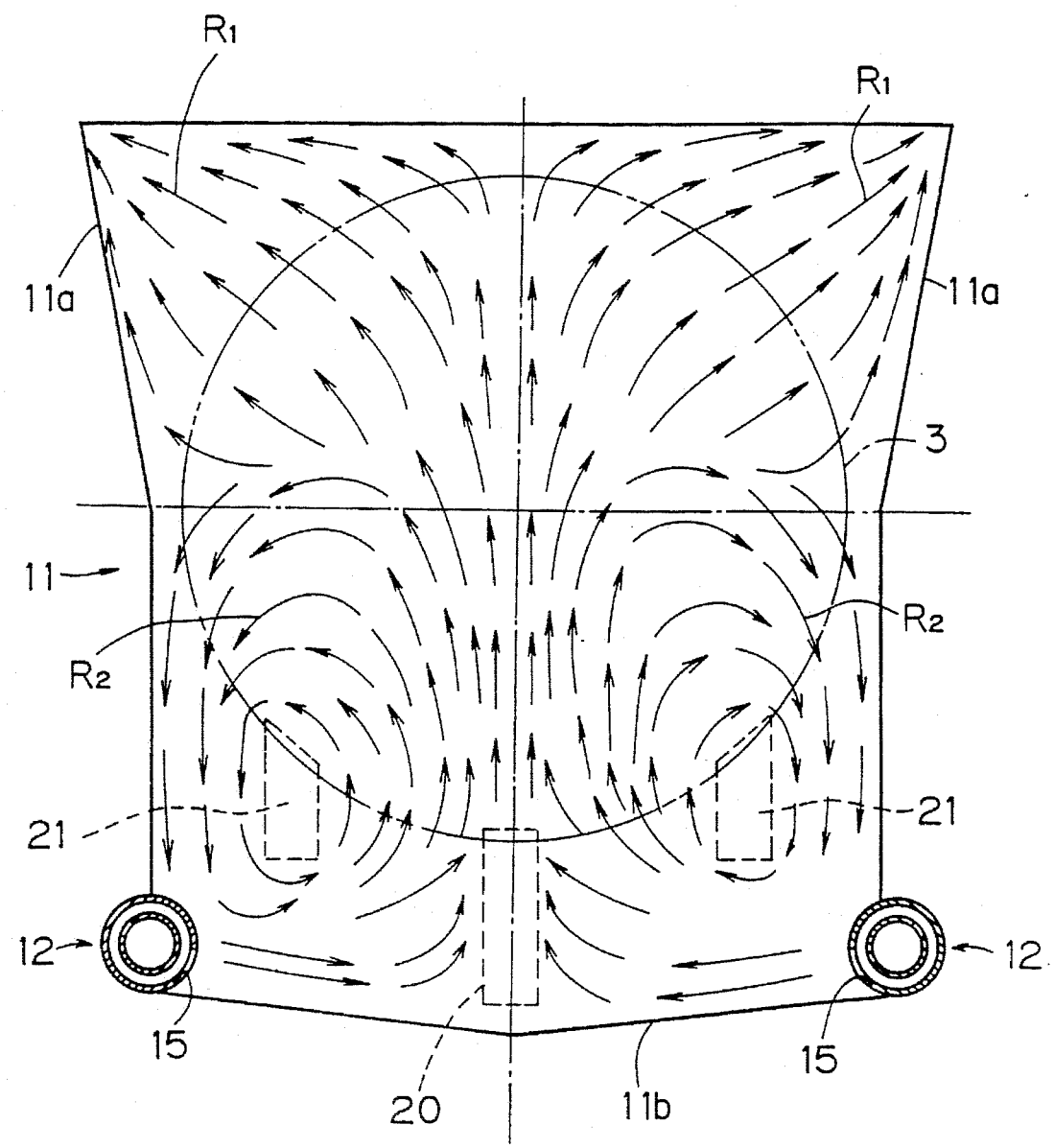
FIG. 6 is a view showing flows of a processing fluid ejected from a processing fluid supply pipe in the first preferred embodiment of the present invention.

FIG. 6 is a diagram of actual flows of the processing fluid 2 supplied to the processing bath 11 from the processing fluid supply apparatus 30 through the processing processing fluid supply pipes 12.

In FIG. 6, ejected from the processing fluid supply pipes 12 through the main outlet holes 15, jets of the processing fluid 2 hit a lower portion of the holding rod 20 and turn upward. The jet flows then rush toward the center of the substrate 3, tracing vertically symmetric routes with respect to a vertical center line of the substrate 3. After evenly sweeping over the entire surface of the substrate 3, some jet flows R1 flow upward along the tapering portions of the processing bath 11 to outside over the brim 11a. Other jet flows R2 turn sideways and flow downward along the inner side walls of the processing bath 11. The flows R2 then join new jet flows of the processing fluid 2 ejected from the main outlet holes 15 and rush toward the holding rod 20 along the bottom surface 11b. While circulating in the entire processing bath 11, the jet flows R2 eventually flow outside over the brim 11a. Hence, a stagnant zone is effectively prevented in the processing bath 11 so that there is no possibility that extraneous materials will be caught in a stagnant zone and adhered onto the surfaces of the substrates 3 again.

The configuration of the bottom surface 11b of the processing bath 11 is not limited to as above. Rather, the bottom surface lib may be flat or may be hill-like shaped. Even if the bottom surface 11b is configured as such, by ejecting the fluid 2 from the processing processing fluid supply pipes 12 approximately parallel to or toward the bottom surface 11b against the holding rod 20, the processing fluid 2 is circulated within the entire processing bath 11 without creating a stagnant zone as described above. As a result, the substrates are processed excellently. Still, when the bottom surface 11b is finished in a valley-like configuration as in the first preferred embodiment, the processing bath 11 is smaller and the amount of the processing fluid 2 needed is less than when the bottom surface 11b is finished flat or in a hill-like shape. This is because the processing fluid supply pipes 12 are located below the bottom center portion CR when the bottom surface 11b is finished in a valley-like configuration.

Although the substrate holder 17 for holding the substrates 3 within the processing bath 11 of the first preferred embodiment is a cantilever holder (See FIG. 3), the substrate holder 17 may a holder in which the holding rods 20, 21 and 21 are carried at the both ends by two suspending members. Alternatively, instead of the substrate holder 17, a regular cassette may be used which has a member corresponding to the diaphragm means attached to the bottom of the cassette. In the first preferred embodiment, the holding rod 20 is placed at the bottom center portion CR by setting the holding position of the substrate holder 17 within the processing bath 11 by means of the transfer mechanism TM. In such a structure, since the holding rod 20 functions as the diaphragm means, the structure of the apparatus is simplified.

Although the lower end of the holding rod 20 and the bottom surface 11b of the processing bath 11 may not be in contact with each other, unlike as shown in FIG. 1 as being a little spaced apart from each other, it is desirable that the lower end of the holding rod 20 and the bottom surface 11b are as close to each other as possible but are not in a complete contact with each other. Care should be taken so that flows of the processing fluid 2 will not be disturbed when the lower end of the holding rod 20 and the bottom surface 11b are spaced away from each other. On the other hand, when the lower end of the holding rod 20 and the bottom surface 11b are in contact with each other, care should be exercised to avoid creation of dust due to the contact.

<Second Preferred Embodiment>

Figure 7:
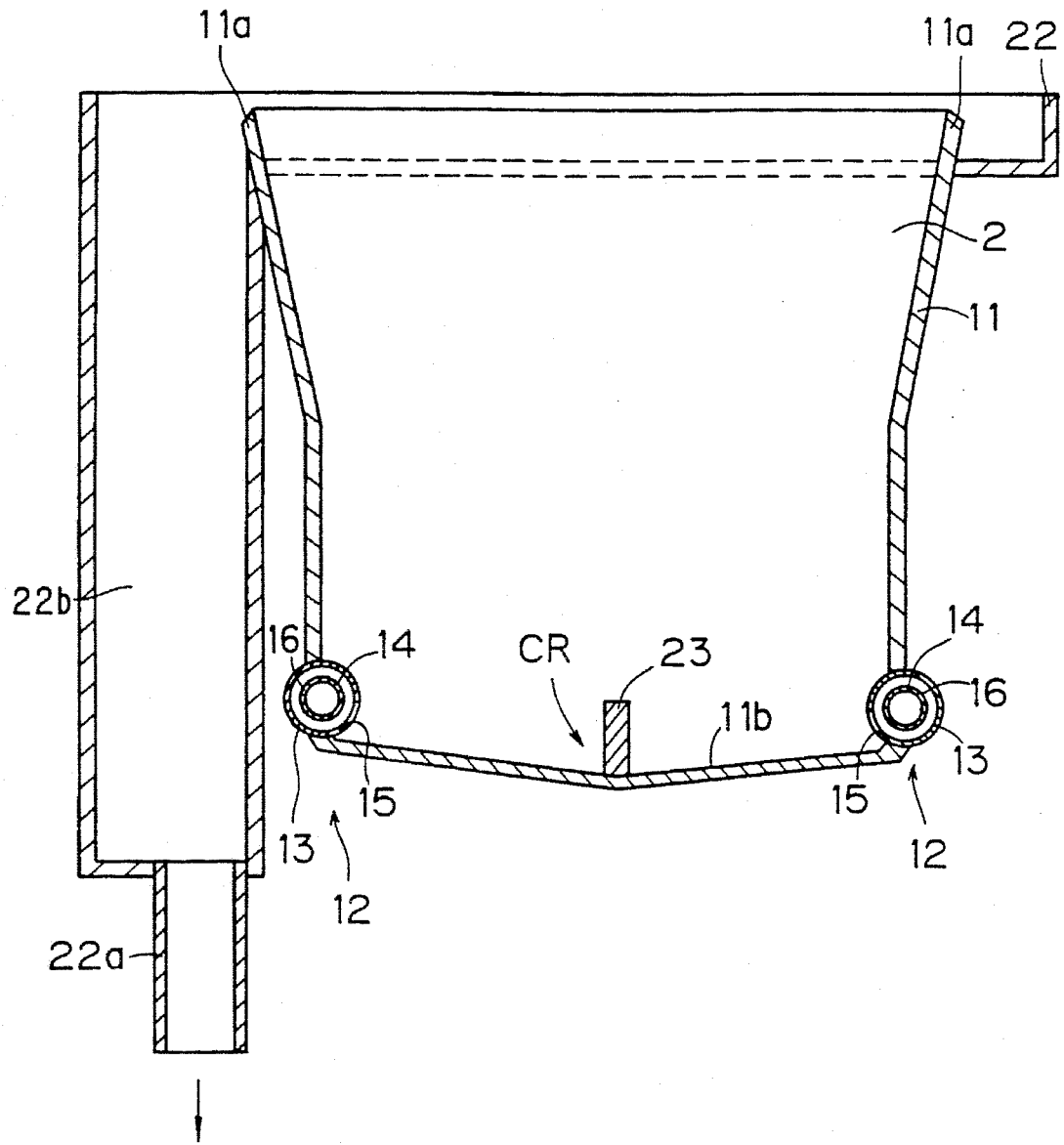
FIG. 7 is a view showing major parts of an immersion-type substrate processing apparatus according to a second preferred embodiment of the present invention.

FIG. 7 is a view showing principal parts of an immersion-type substrate processing apparatus according to a second preferred embodiment of the present invention. In FIG. 7, a major difference of the second preferred embodiment from the first preferred embodiment is that a plate member 23 projects from the bottom surface 11b in the bottom center portion CR in the second preferred embodiment. The second preferred embodiment is otherwise approximately similar to the first preferred embodiment. Similar symbols and reference numbers are allotted to corresponding parts, by which the similar structure is regarded as explained.

Figure 8:
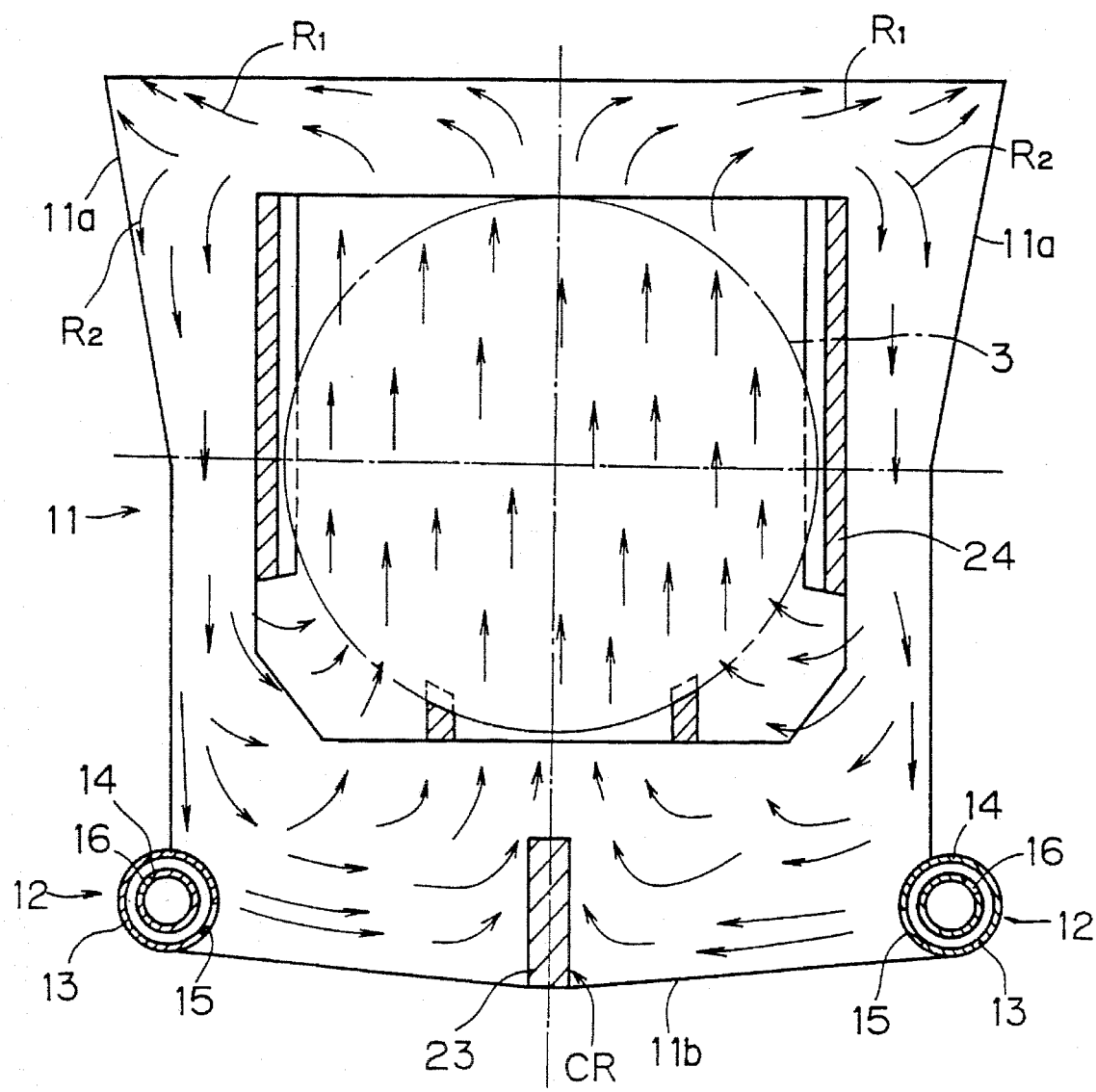
FIG. 8 is a view showing flows of a processing fluid ejected from processing processing fluid supply pipe in the second preferred embodiment of the present invention.

In the second preferred embodiment, the projecting plate member 23 serves as a diaphragm means like the holding rod 20 of the substrate holder 17. Hence, as shown in FIG. 8, when the processing fluid 2 is ejected from the processing processing fluid supply pipes 12 after a cassette 24 containing the substrates 3 is immersed into the processing bath 11, the processing fluid 2 gushed out from the main outlet holes 15 of the processing processing fluid supply pipes 12 hits the plate member 23 and turns upward at the plate member 23. Jet flows then rush toward the center of the substrate 3 tracing vertically symmetric routes with respect to a vertical center line of the substrate 3. After uniformly sweeping over the entire surface of the substrate 3, some jet flows R1 flow upward along the tapering portions of the processing bath 11 to outside over the brim 11*a*. Other jet flows R2 turn sideways and flow downward along the inner side walls of the processing bath 11. The jet flows R2 then join new jet flows of the processing fluid 2 ejected from the main outlet holes 15 and rush toward the holding rod 20 along the bottom surface 11*b*. While circulating in the entire processing bath 11, the jet flows R2 eventually flow outside over the brim 11*a*. Hence, creation of a stagnant zone is effectively prevented in the processing bath 11 so that there is no possibility that extraneous materials will be caught in a stagnant zone and adhered onto the surfaces of the substrates 3 again.

The configuration of the bottom surface 11*b* of the processing bath 11 is not limited to that shown in FIG. 7, but rather are optional as in the first preferred embodiment.

Figure 23:
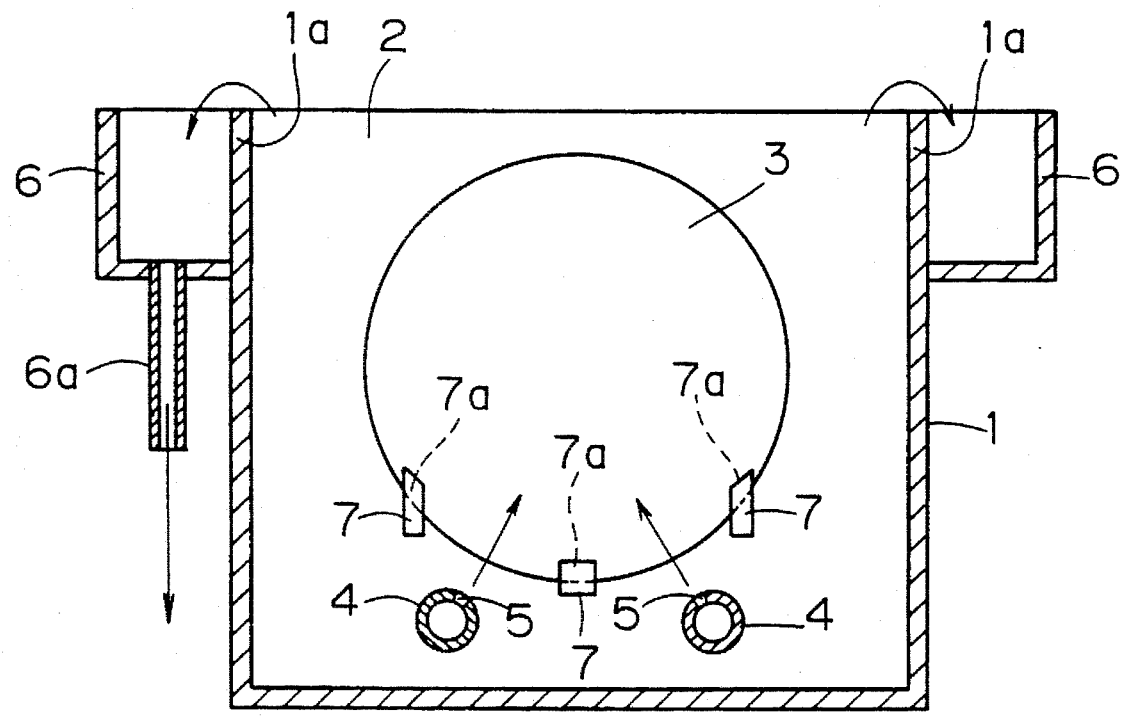
FIG. 23 is a vertical cross sectional view showing major parts of a conventional immersion-type substrate processing apparatus.
Figure 24:
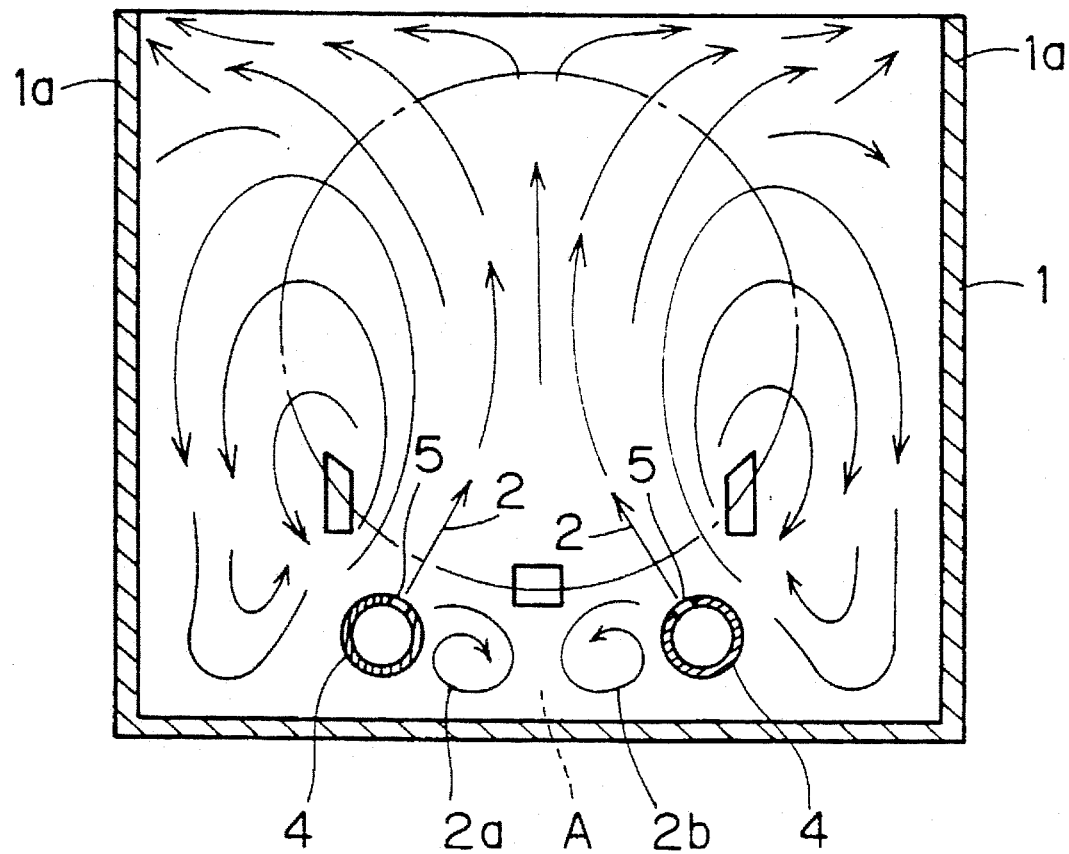
FIG. 24 is a view showing flows of a processing fluid ejected from processing fluid supply pipes of the conventional immersion-type substrate processing apparatus.

The effect above is also ensured when the substrate holder 17 of the first preferred embodiment and substrate holding rods 7 of FIG. 23 are used instead of the cassette 24.

<Third Preferred Embodiment>

Figure 9:
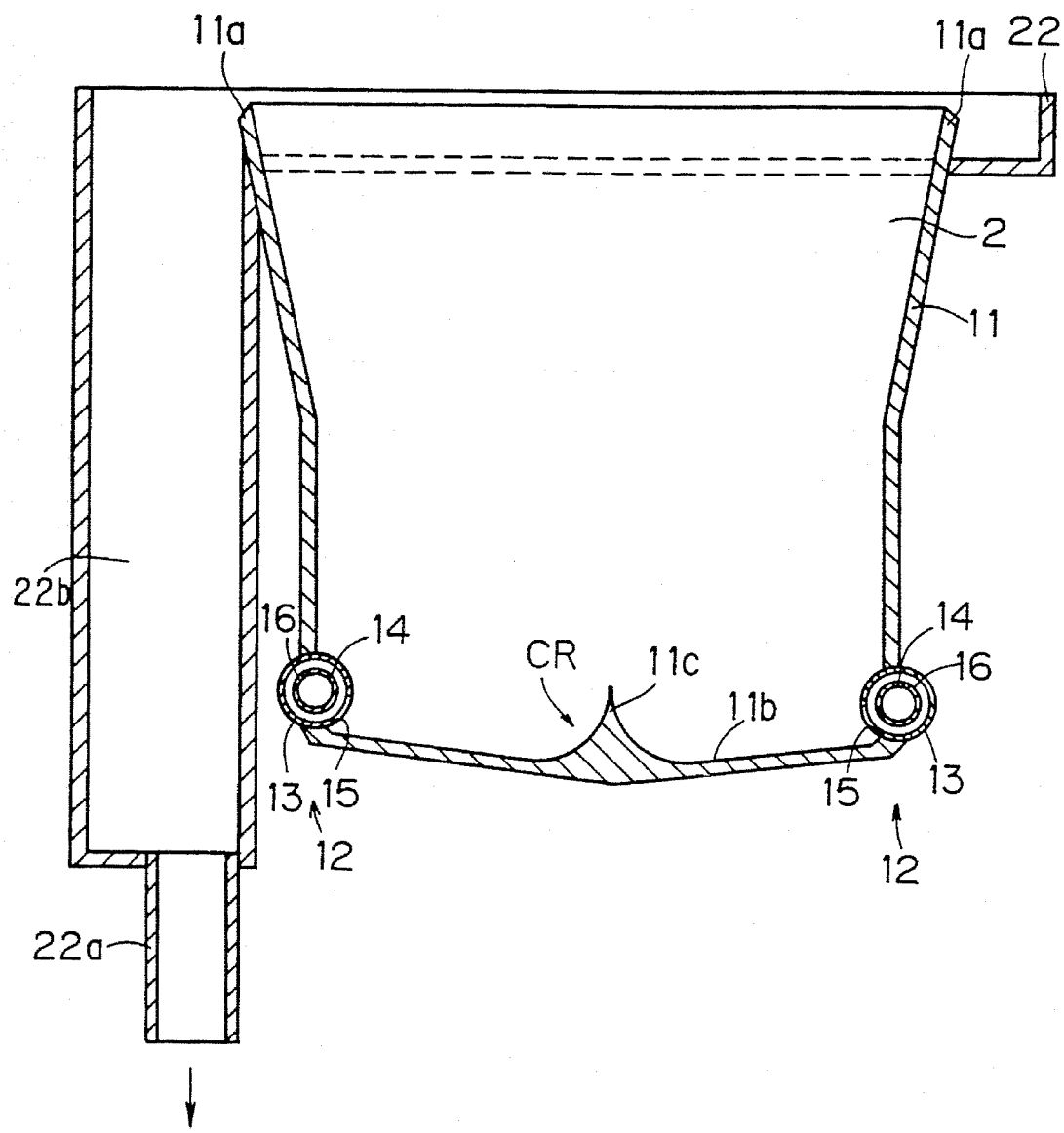
FIG. 9 is a view showing major parts of an immersion-type substrate processing apparatus according to a third preferred embodiment of the present invention.

FIG. 9 is a view showing major parts of an immersion-type substrate processing apparatus according to a third preferred embodiment of the present invention. The bottom surface 11*b* of the processing bath 11 of the third preferred embodiment includes a projection 11*c* at the bottom center portion CR. In the third preferred embodiment, the projection 11*c* serves as diaphragm means. The fluid 2 from the processing processing fluid supply pipes 12 rushes approximately parallel to the bottom surface 11*b* toward the bottom center portion CR against the projection 11*c*. Hence, the processing fluid 2 is circulated within the entire processing bath 11 without creating a stagnant zone as in the first and the second preferred embodiments, and therefore, the substrates are processed excellently.

<Dual-Pipe Structure and Effect of the Same>

Figure 10:
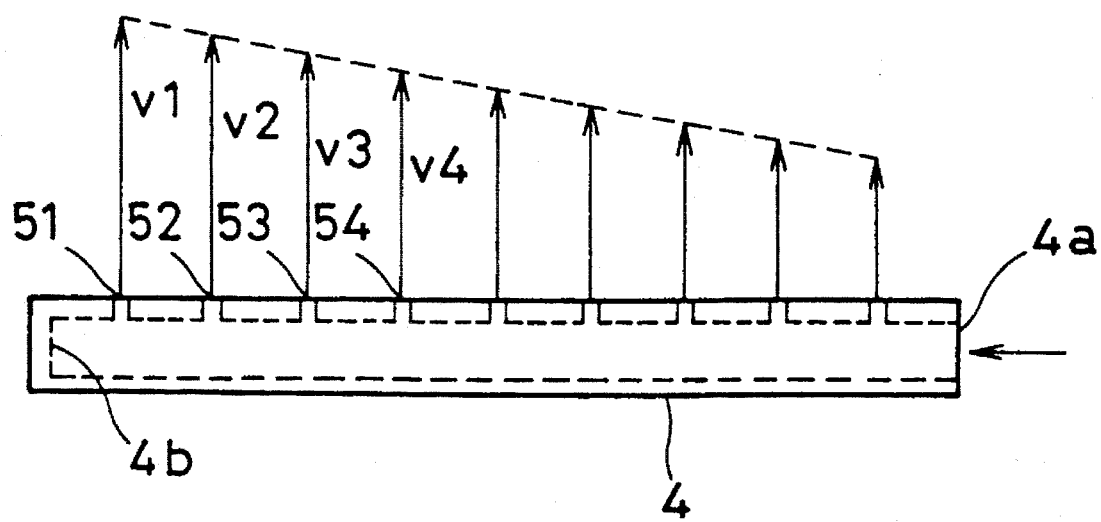
FIG. 10 is a view showing a change in the outlet speed of a processing fluid ejected from a processing fluid supply pipe of a single-layer structure.

FIG. 10 is a diagram of a processing fluid supply pipe 4 of a single-layer pipe structure. The outlet holes 5 (51, 52, . . . ) are formed on a side surface of the processing fluid supply pipe 4 in a line at predetermined intervals along the length of the processing fluid supply pipe 4 to face the bottom center portion CR of the processing bath. With a predetermined type of the processing fluid 2 supplied from the externally disposed processing fluid supply apparatus 30 (See FIG. 5) to an inlet 4*a*, the processing fluid supply pipe 4 ejects the processing fluid 2 through the outlet holes 5 toward the substrates 3. Here, outlet speeds v1, v2, v3 . . . of the processing fluid 2 from the respective outlet holes 51, 52, 53, . . . change as shown in FIG. 10. More exactly, the outlet speed v1 at the outlet hole 51 located nearest the end (turning point) 4*b* of the pipe 4 is fastest. The outlet speeds become approximately proportionally slower at outlet holes 52, 53, 54, . . . further from the end 4*b* toward inlet 4*a*.

In a sharp contrast from this, with respect to the processing fluid supply pipes 12 having a dual-layer pipe structure of the preferred embodiments of the present invention, outlet speeds at the respective main outlet holes 15 are equal to each other.

Figure 11:
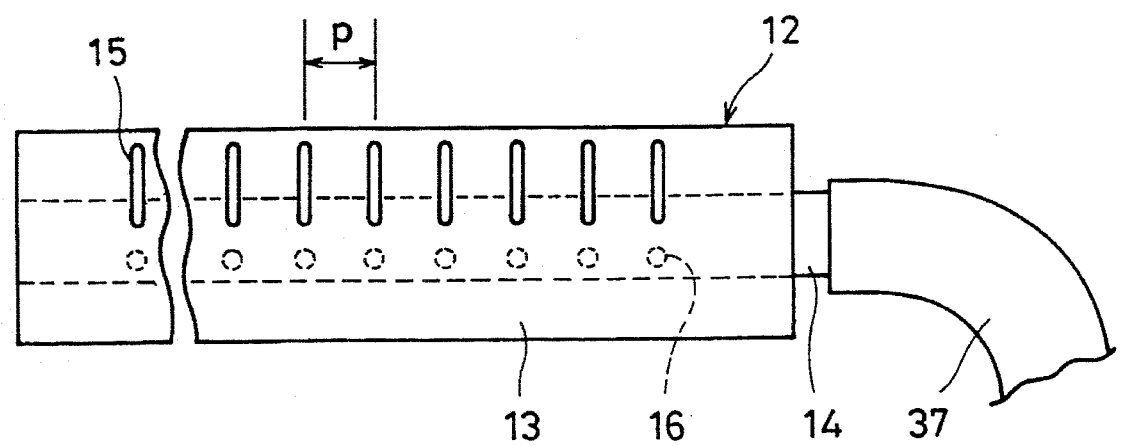
FIG. 11 is a view of an appearance of a processing fluid supply pipe of the first preferred embodiment of the present invention.

FIG. 11 is a view showing an appearance of the processing fluid supply pipe 12 having a dual-layer pipe structure used in the preferred embodiments of the present invention. The pitch of the main outlet holes 15 is the same as the pitch p of the guide grooves 20*a* of the substrate holder 17. By disposing the processing fluid supply pipes 12 in such a manner that the main outlet holes 15 are each located between the substrates 3, the substrates 3 are effectively processed at their surfaces with the processing fluid 2 rushing between each adjacent substrates 3.

The internal pipe 14 is connected to the supply tube 37 to receive the processing fluid 2 from the processing fluid supply apparatus 30 (See FIG. 5).

Figure 12:
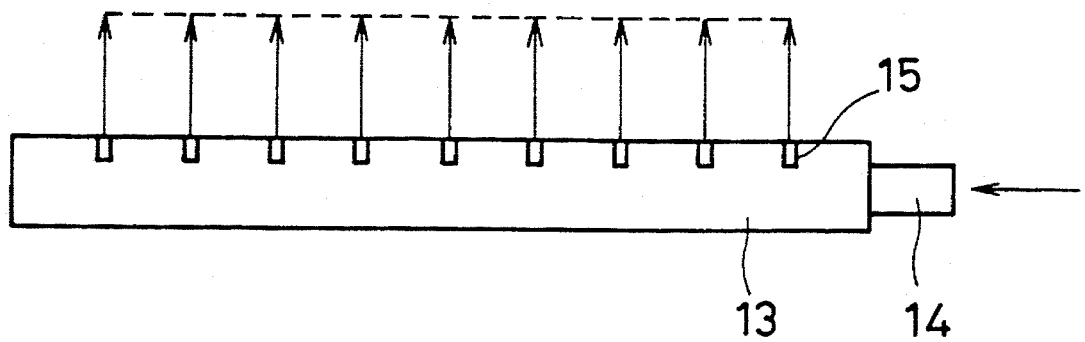
FIG. 12 is a view showing equalization of outlet speeds of jet flows of a processing fluid ejected from the processing processing fluid supply pipe of FIG. 2.

FIG. 12 is a view showing a result of an experiment regarding outlet speeds of the processing fluid 2 ejected from the main outlet holes 15 of the processing fluid supply pipes 12. In FIG. 12, the outlet speeds at the main outlet holes 15 are approximately the same. Since the amounts of the processing fluid 2 ejected from the outlet holes 15 toward the substrates 3 are equal to each other, uniform surface processing is possible.

The equal outlet speeds are achieved because of the following reason. The processing fluid 2 ejected from the sub outlet holes 16 of the internal pipe 14 hit the interior wall of the external pipe 13 at points T (See FIG. 13A). At these collision points T, the speed of jet flows are reduced to zero. From the collision points T, each serving as a new starting point toward the main outlet holes 15 of the external pipe 13, the jet flows of the processing fluid 2 are ejected out from the main outlet holes 15 through flow paths $PT_1$ and $PT_2$.

Thus, since the flow seeds of the processing fluid 2 at the main outlet holes 15 are equalized when the processing fluid supply pipes 12 have a dual-layer pipe structure, the balance of the outlet speeds between the main outlet holes 15 will remain unchanged even if the sizes of the main outlet holes 15 are increased. Because of this, it is allowable that the main outlet holes 15 are each formed as a slit hole.

Slit-like main outlet holes 15 of a larger opening area have an advantage that the substrates 3 will not be charged up since, unlike in the conventional substrate processing apparatus, the outlet speeds remain the same even when a supply of the processing fluid 2 is increased. In addition, since the width of the processing fluid 2 is wide when the processing fluid 2 is ejected from a slit, the substrates 3 are processed by the processing fluid 2 which evenly sweeps over the surfaces of the substrates 3.

Now, a description will be given on an influence of the positional relationship between the external and the internal pipes 13 and 14 and the configuration of the main outlet holes 15 over flows of the processing fluid 2 which is ejected from the main outlet holes 15.

A. Sizes of and Positional Relation between External and Internal Pipes (1) Coaxial Dual-Layer Pipe FIGS. 13A and 13B are diagrams showing flows of the processing fluid 2 when the processing fluids 2 are supplied to two different types of coaxial dual-layer processing processing fluid supply pipes 12 at the same speed.

Figure 13A:
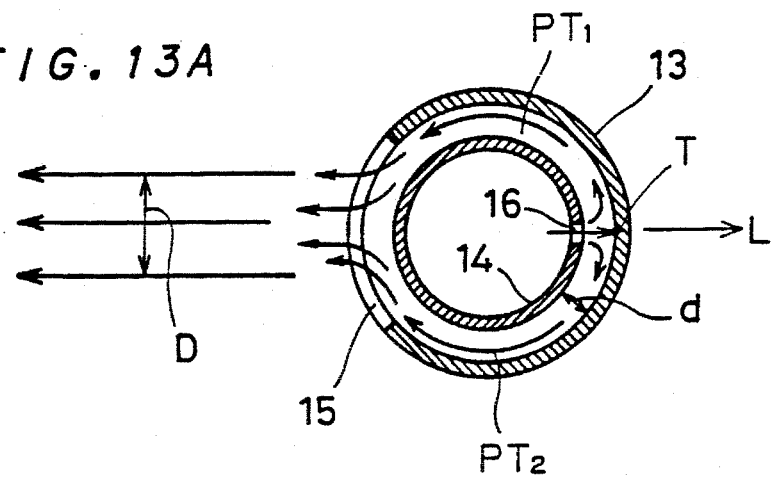
FIGS. 13A, 13B and 13C are views showing flows of a processing fluid from processing fluid supply pipes.

Condition in FIG. 13A

Figure 13B:
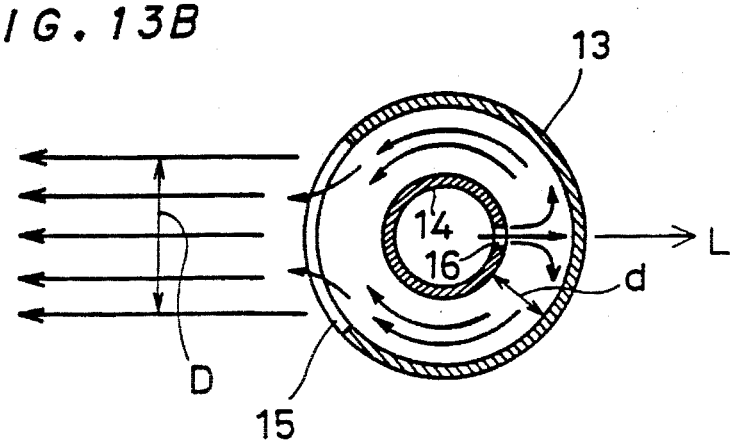

Inner diameter of the external pipe 13: 40 mm
Outer diameter of the internal pipe 14: 30 mm
Opening angle of the slit: 90 degrees
Width of flow path d: 5 mm Condition in FIG. 13B

Inner diameter of the external pipe 13: 40 mm
Outer diameter of the internal pipe 14: 20 mm
Opening angle of the slit: 90 degrees
Width of flow path d: 10 mm As can be understood from a comparison of FIGS. 13A and 13B, the outlet width D of the processing fluid 2 is wider in FIG. 13B, where the width d of the flow path is wider (The width d is calculated by dividing a difference between the inner and the outer diameters of the external and the internal pipes 13 and 14 by 2).

Figure 14:
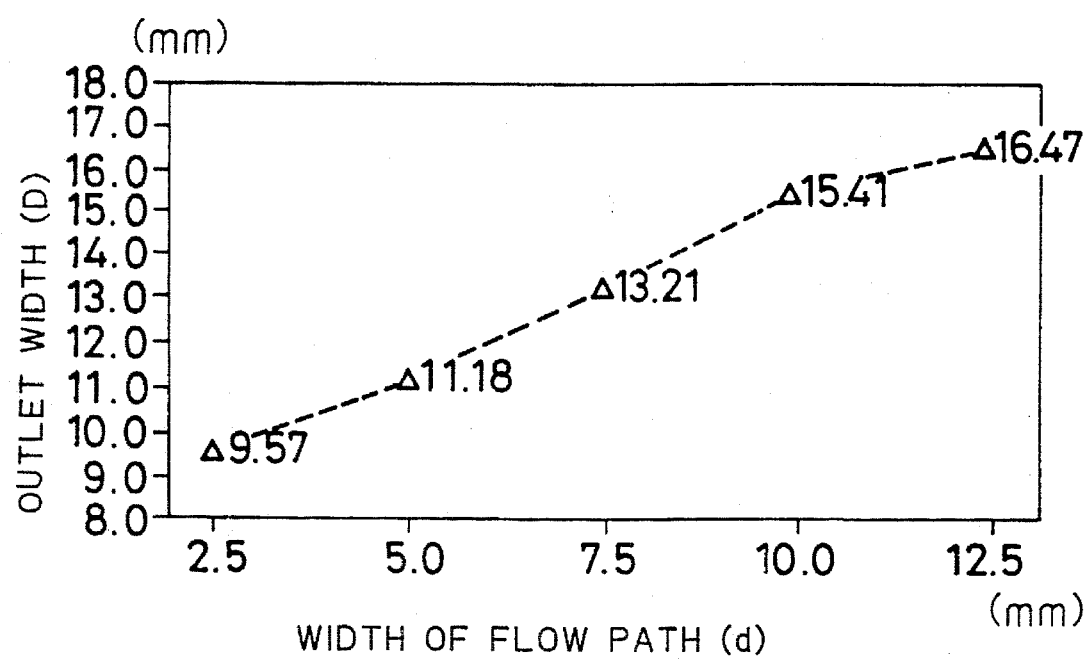
FIG. 14 is a graph plotting an outlet width against the width of a flow path.

FIG. 14 is a graph plotting the outlet width D of the processing fluid 2 against the width d of the flow path.

From FIG. 14, it is understood that the outlet width D of the processing fluid 2 is increased by using the internal pipe of as small an outer diameter as possible and by consequently increasing the width d of the flow path.

The result of the experiment is significant since the outlet width D of the processing fluid 2 should be as large as possible to realize uniform flows of the processing fluid 2 within the processing bath 11 and to eventually reduce a stagnant zone.

If the width d of the flow path is large, the speeds of the processing fluid 2 flowing through the flow paths $PT_1$ and $PT_2$ are small, and therefore, collision force of the processing fluid 2 at the opening of the slit is weak. Hence, the processing fluid 2 easily diffuses. This is considered to explain the result of the experiment.

The opening angle of each main jet outlet 15 is set at 90 degrees in this embodiment. However, since the outlet width D of the processing fluid 2 largely changes depending on the width d of the flow path as described above, the opening angle of each main jet outlet 15 should be rationally set considering such conditions.

(2) Eccentric Dual-Layer Pipe

Figure 13C:
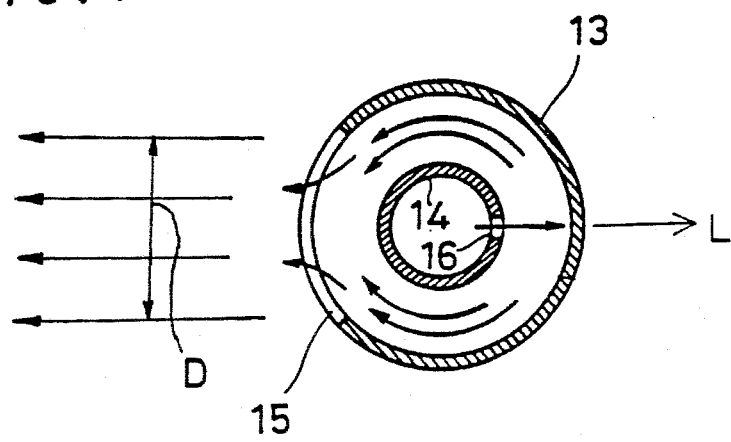

The above has described an experiment where the processing processing fluid supply pipes 12 are each a coaxial dual-layer pipe. Now, a description will be given on an experiment where the internal pipe 14 is shifted off-center away from the main outlet holes 15 of the external pipe 13 as shown in FIG. 13C to observe a change in the outlet width D of the processing fluid 2. FIG. 15 shows a result of the experiment (The inner diameter of the external pipe 13 is fixed at 40 mm).

In the graph of FIG. 15, an eccentricity (mm) from the coaxial location toward a direction L, see FIG. 13C, is measured along the horizontal axis, and a ratio of a change in the outlet width D is measured along the vertical axis. The ratio is 1 when the eccentricity is zero. The dot-dot-dash line 41 expresses a change in the outlet width D when the width d of the flow path is 5 mm. The dot-and-dash line 42 expresses a change in the outlet width D when the width d of the flow path is 7.5 mm. The dotted line 43 expresses a change of in the outlet width D when the width d of the flow path is 10 mm, and the solid line 44 expresses a change of in the outlet width D when the width d of the flow path is 4.5 mm.

The graph shows that the outlet width D decreases as the eccentricity increases when the width d is 10 mm and 4.5 mm. However, when the width d is 7.5 mm, the outlet width D remains almost unchanged even when the internal pipe 14 is off-centered. When the width d is 5 mm, the outlet width D becomes larger with an increase in the eccentricity when the internal pipe 14 is shifted off-center than when the internal pipe 14 is disposed at a coaxial position.

Thus, the outlet width D can be increased by disposing the internal pipe 14 at an eccentric position at least when the width d is 5 mm or smaller.

Hence, even when it is not possible to set the width d at a large value due to some structural restraint, the outlet width D is increased by disposing the internal pipe 14 at an eccentric position a little toward the direction L.

Alternatively, the internal pipe 14 may be off-centered toward a direction which is perpendicular to the direction L. In such a case, due to the eccentric location of the internal pipe 14, the width of a flow path between the exterior wall of the internal pipe 14 and the interior wall of the external pipe 13 is small near the eccentric location of the internal pipe 14 but is large at the opposite side. Hence, due to a difference in the amount of the processing fluid 2 between the two flow paths, the ejecting direction of the processing fluid 2 from the main outlet holes 15 can be directed toward the eccentric location of the internal pipe 14.

B. Configuration of Slit (1) Instead of forming the main outlet holes 15 each as a slit hole having the opening angle of 90 degrees as in the preferred embodiments above, for example, the main outlet holes 15 may be formed each as a series of short slit holes which are arranged at the same opening angle as shown in FIGS. 16A and 16B.

Figure 16A:
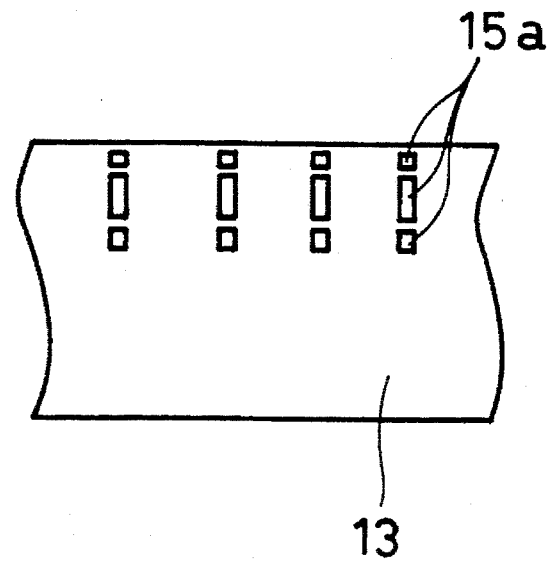
FIGS. 16A and 16B are a side view and a horizontal cross sectional view of a processing fluid supply pipe of other preferred embodiment, respectively.
Figure 16B:
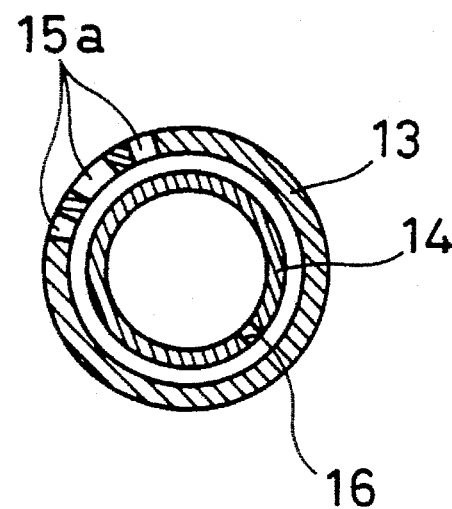

FIG. 16A shows an appearance of the main jet outlet 15 which consists of three short slits 15a, and FIG. 16B shows the cross section of such a main jet outlet 15. When each main jet outlet 15 is formed by a plurality of short slits which are arranged at the same opening angle, it seems that the opening area is reduced and the ejection condition of flows from the slits is deteriorated. However, in reality, the outlet width D of the processing fluid 2 tends to widen.

Figure 18:
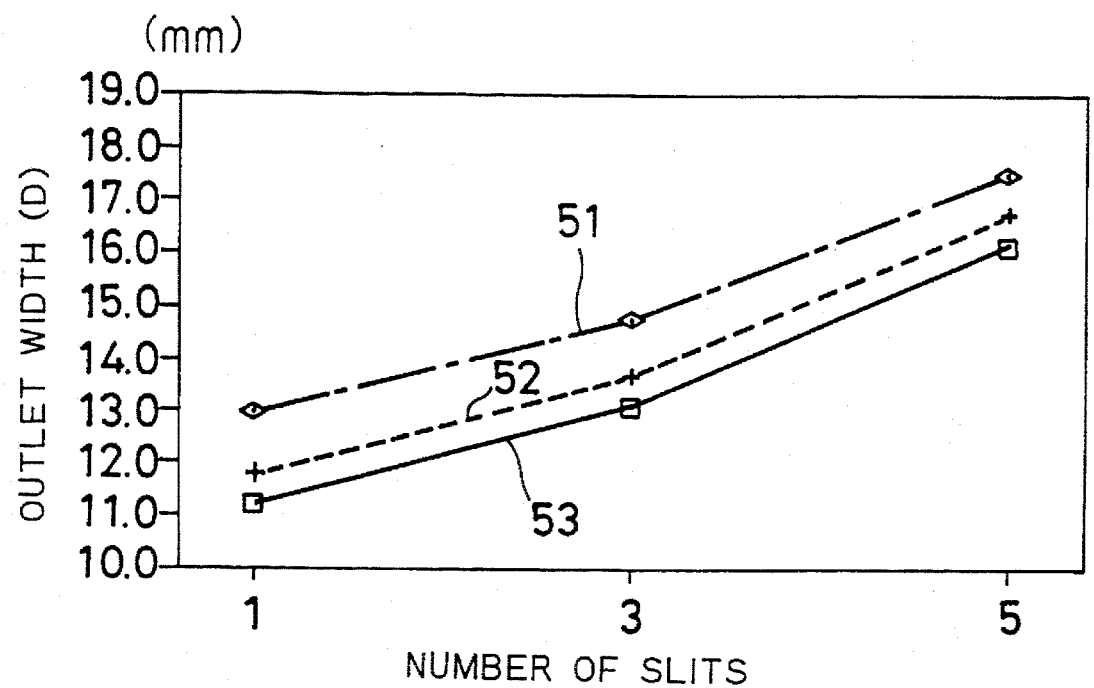
FIG. 18 is a graph showing a relation between the number of slits, an outlet width and an eccentricity of an internal pipe.

FIGS. 17A, 17B and 17C show the processing processing fluid supply pipes 12 in which the main outlet holes 15 are each formed as one long slit, three short slit holes 15b which are arranged at equal intervals and five short slit holes 15c which are arranged at equal intervals, respectively, within the opening angle of 90 degrees in the respective external pipes 13 (The internal pipe 14 is omitted). An experiment was conducted to observe flows from these processing processing fluid supply pipes 12, and results of the experiment were plotted as a graph measuring the number of the slits along the horizontal axis and the outlet width D along the vertical axis. FIG. 18 shows the graph.

The measurements were obtained under a condition that the inner diameter of the external pipe is 40 mm and the outer diameter of each internal pipe is 30 mm. The dot-and-dash line 51 expresses a change in the outlet width D of when the internal pipe 14 is off-centered by 4 mm, the dotted line 52 expresses a change in the outlet width D of when the internal pipe 14 is off-centered by 2 mm, and the solid line 53 expresses a change in the outlet width D regarding a coaxial dual-layer pipe (the internal pipe 14 is not deviated off-center).

As can be easily seen from the graph, the outlet width D increases as the number of the slits increases, regardless of whether the internal pipe 14 is coaxially disposed or off-centered.

Figure 19:
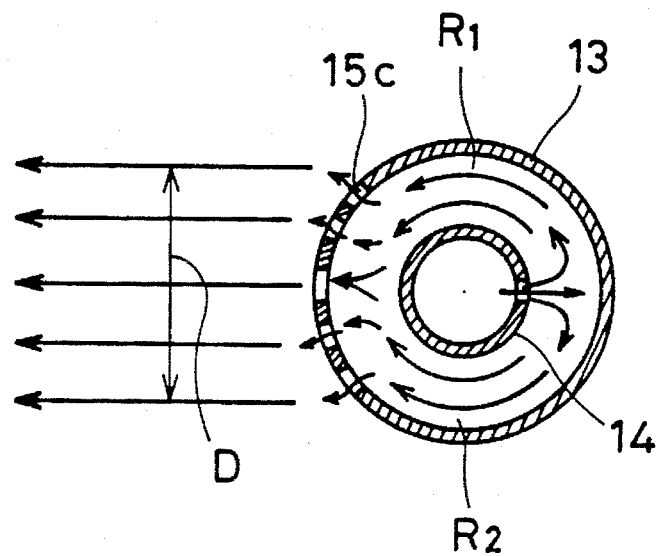
FIG. 19 is a view showing flows of a processing fluid ejected from main outlet holes which are each formed by five short slits.

FIG. 19 schematically shows flows of the processing fluid 2 from the main outlet holes 15 of a coaxial dual-layer pipe in which the main outlet holes 15 are each formed by five short slits (which corresponds to FIG. 17C) (The inner diameter of the external pipe is 40 mm, the outer diameter of the internal pipe is 20 mm, and the opening angle is 90 degrees).

Although the inner and the outer diameters of the external and the internal pipes and the opening angle are same, as compared with FIG. 13B, the outlet width D is apparently larger in FIG. 14 than in FIG. 13B.

The reason is as follows. Since the main outlet holes 15 are each divided into the five short slits, the processing fluid 2 is not directly ejected outside from the main outlet holes 15. Rather, collision of flows of the processing fluid 2 from the flow paths $PT_1$ and $PT_2$ is moderated, and the flows of the processing fluid 2 are diffused at and ejected from the short slits which are located within a wide opening angle.

Figure 20:
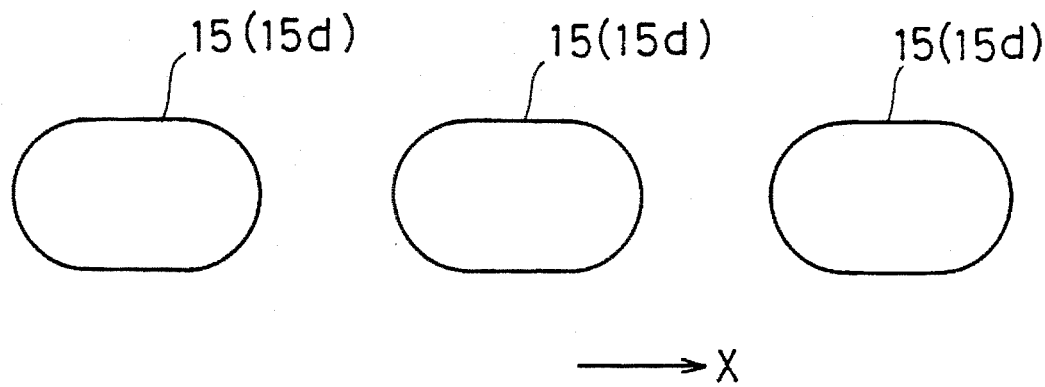
FIG. 20 is a view of main outlet holes of other configuration.
Figure 21:
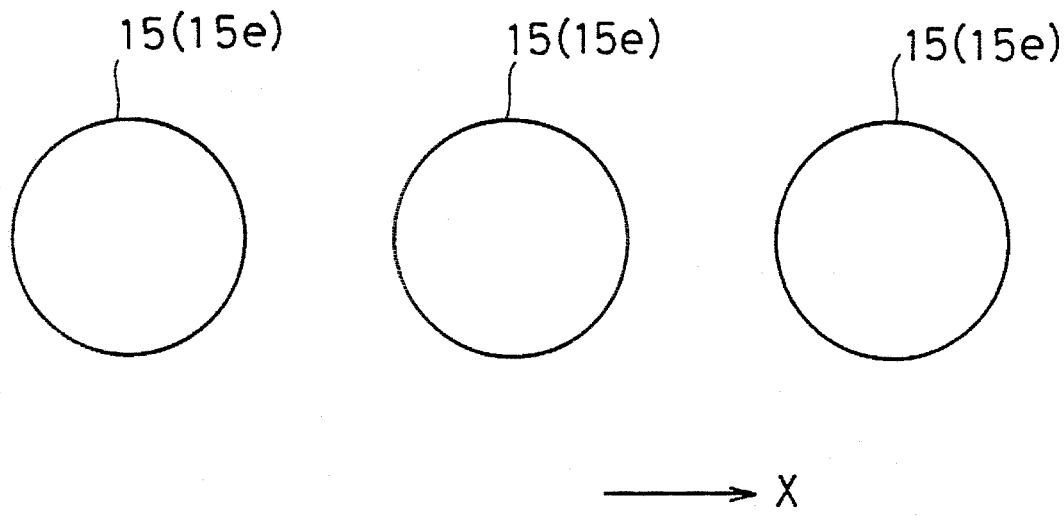
FIG. 21 is a view of main outlet holes of still other configuration.

(2) In the preferred embodiment hereinabove described, the main outlet holes 15 are each formed as a slit hole which extends in a direction perpendicular to the longitudinal direction of the processing fluid supply pipes 12 (See FIG. 11). However, each main jet outlet 15 may be formed by slit holes 15d which extend in the longitudinal direction X of the processing fluid supply pipes 12 as shown in FIG. 20, or by circular holes 15e as those shown in FIG. 21.

Figure 22:
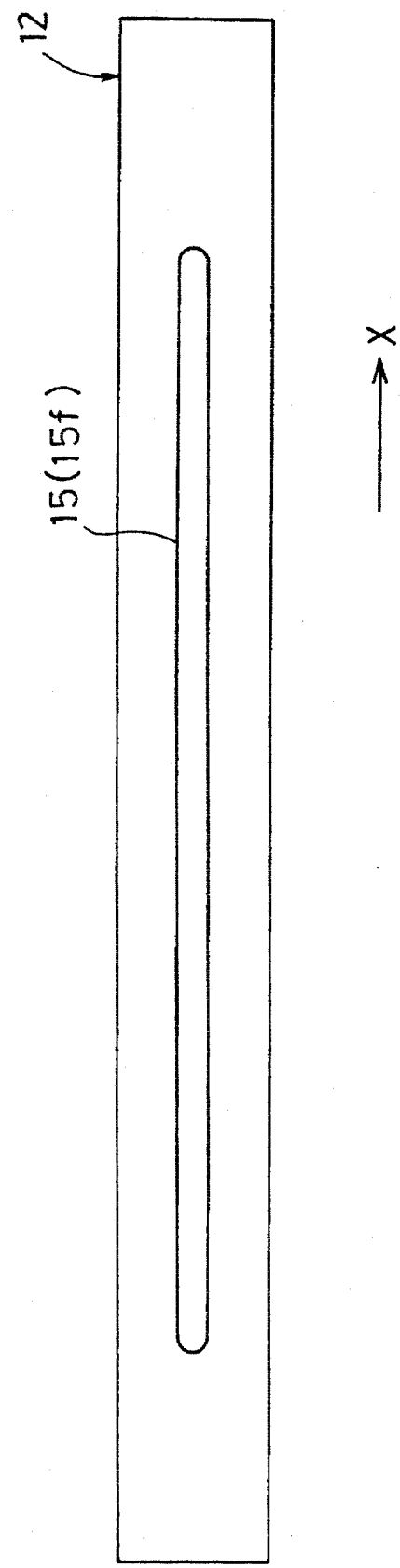
FIG. 22 is a front view of a processing processing fluid supply pipe of still other structure.

(3) The plurality of the main outlet holes 15 are formed on the side surfaces of the processing fluid supply pipes 12 along the longitudinal direction X of the processing fluid supply pipes 12 in the preferred embodiments hereinabove described. Instead, as a main jet outlet, the fluid supply pipes 12 may each have one long slit hole 15f as that shown in FIG. 22 which extends in the longitudinal direction X of the processing processing fluid supply pipes 12. Through such a main outlet hole 15, a processing fluid is ejected toward the substrates 3 which are held in the processing bath 11.

Thus, a more ideal supply of the processing fluid 2 is possible by modifying the structure of the processing fluid supply pipes 12 in accordance with a need.

When outlet width D of the processing fluid 2 is increased only one processing fluid supply pipe 12 may be disposed in the center although two processing processing fluid supply pipes 12 are used in the preferred embodiments hereinabove described, one on the right side and the other on the left side. Of course, although three or more processing fluid supply pipes 12 may be used, care should be taken such that there will be as little stagnant zones as possible and supplies from the right side and the left side processing processing fluid supply pipes 12 are in a good balance.

As described earlier, the processing fluid 2 gushed out from the sub outlet holes 16 of the internal pipe 14 hits the interior wall of the external pipe 13 and loses its speed so that the speeds of jet flows of the processing fluid 2 at the main outlet holes 15 become equal to each other. It then follows that each sub jet outlet 16 may not be always 180 degrees shifted away from the center of the opening of each main jet outlet 15. Rather, it is only necessary that the openings of the outlet holes 15 and 16 are not aligned with each other. However, when the sub outlet holes 16 and the main outlet holes 15 are not on the opposite side to each other, since the flow paths $PT_1$ and $PT_2$ are not equal to each other anymore, chances are that the direction and the width of jet flows of the processing fluid will change.

In addition, it is apparent that jet flows of the processing fluid rush out from the processing fluid supply pipes 12 at even more uniform outlet speeds if the processing fluid supply pipes 12 are each constructed as a multi-layer pipe which includes two or more internal pipes and outlet holes of the internal and the external pipes are not aligned with each other. While the invention has been described in detail, the foregoing description is in all aspects illustrative and not restrictive. It is understood that numerous other modifications and variations can be devised without departing from the scope of the invention.

We claim:

1. An immersion-type substrate processing apparatus for immersing a substrate into a processing fluid and processing surfaces of said substrate, comprising:

a processing bath for containing said processing fluid, said processing bath having a bottom surface;

two processing processing fluid supply pipes provided in the vicinity of said bottom surface of said processing bath to be parallel to each other but spaced away from each other by a predetermined distance, said processing fluid supply pipe each including an outlet hole through which said processing fluid is gushed out approximately parallel to or toward said bottom surface of said processing bath;

processing fluid supply means disposed external to said processing bath so as to supply said processing fluid to said processing fluid supply pipes; and diaphragm means disposed close to said bottom surface of said processing bath in a bottom center portion of said processing bath between said processing fluid supply pipes so as to change the direction of said processing fluid gushed out from said outlet holes so that said processing fluid flows toward an upward direction.

2. The immersion-type substrate processing apparatus according to claim 1, further comprising a member for holding said substrate in said processing bath, wherein a portion of said member serves as said diaphragm means when said member is located into said processing bath.

3. The immersion-type substrate processing apparatus according to claim 2, wherein said portion of said member is close to said bottom surface but is not in contact with said bottom surface.

4. The immersion-type substrate processing apparatus according to claim 1, wherein said diaphragm means is a plate member which extends upwardly from said bottom surface of said processing bath.

5. The immersion-type substrate processing apparatus according to claim 1, wherein said bottom surface of said processing bath includes a projected portion which projects in said bottom center portion, and said projected portion serves as said diaphragm means.

6. The immersion-type substrate processing apparatus according to claim 1, wherein said bottom surface has a valley-like configuration.

7. The immersion-type substrate processing apparatus according to claim 6, wherein said bottom surface is deepest at the center.

8. The immersion-type substrate processing apparatus according to claim 1, wherein said processing fluid supply pipes each includes an external pipe and at least one internal pipe which is inserted in said external pipe to have a multi-layer pipe structure, said outlet hole is formed in said external pipe as a main outlet hole, and said at least one internal pipe includes a sub outlet hole on a side surface thereof, an opening phase of said sub outlet hole formed in said at least one internal pipe is deviated from an opening phase of said main outlet hole formed in said external pipe so that openings of said main and sub outlet holes are not aligned with each other, and wherein said processing fluid supply means is connected to the inner-most internal pipes of said processing processing fluid supply pipes to supply said processing fluid into said processing bath.

9. The immersion-type substrate processing apparatus according to claim 8, wherein said at least one internal pipe is coaxial with said external pipe.

10. The immersion-type substrate processing apparatus according to claim 8, wherein said at least one internal pipe is eccentric with said external pipe.

11. The immersion-type substrate processing apparatus according to claim 10, wherein said at least one internal pipe is shifted off-center away from said main outlet hole of said external pipe.

12. The immersion-type substrate processing apparatus according to claim 8, wherein the center of the opening of said sub outlet hole is exactly 180 degrees shifted away from the center of the opening of said main outlet hole.

\* \* \* \* \*